(12) United States Patent
Uchida et al.

(10) Patent No.: US 10,401,441 B2
(45) Date of Patent: Sep. 3, 2019

(54) MAGNETIC SENSOR

(71) Applicant: TDK CORPORATION, Tokyo (JP)

(72) Inventors: Keisuke Uchida, Tokyo (JP); Kenzo Makino, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 36 days.

(21) Appl. No.: 15/891,576

(22) Filed: Feb. 8, 2018

(65) Prior Publication Data

US 2018/0275217 A1 Sep. 27, 2018

(30) Foreign Application Priority Data

Mar. 24, 2017 (JP) .................................. 2017-059291

(51) Int. Cl.
| | |
|---|---|
| *G01B 7/14* | (2006.01) |
| *G01B 7/30* | (2006.01) |
| *G01R 33/06* | (2006.01) |
| *G01R 33/09* | (2006.01) |
| *H01L 43/08* | (2006.01) |
| *G01R 33/07* | (2006.01) |

(52) U.S. Cl.
CPC ........... *G01R 33/093* (2013.01); *G01R 33/09* (2013.01); *G01R 33/091* (2013.01); *G01R 33/096* (2013.01); *G01R 33/098* (2013.01); *H01L 43/08* (2013.01); *G01R 33/07* (2013.01)

(58) Field of Classification Search
CPC .... G01R 33/09; G01R 33/093; G01R 33/091; G01R 33/098; G01R 33/096; G01R 33/07; G01R 33/06

USPC .......... 324/51, 55, 178, 200, 207.11, 207.13, 324/207.21, 252, 341
See application file for complete search history.

(56) References Cited

U.S. PATENT DOCUMENTS

| | | | |
|---|---|---|---|
| 2012/0200292 A1 | 8/2012 | Sugihara et al. | |
| 2015/0177337 A1 | 6/2015 | Yamashita et al. | |

(Continued)

FOREIGN PATENT DOCUMENTS

| | | |
|---|---|---|
| JP | H05-45175 A | 2/1993 |
| JP | 2013-032989 A | 2/2013 |

(Continued)

*Primary Examiner* — Jermele M Hollington
*Assistant Examiner* — Raul J Rios Russo
(74) *Attorney, Agent, or Firm* — Oliff PLC

(57) ABSTRACT

A magnetic sensor includes a magnetic field conversion unit and a magnetic field detection unit. The magnetic field conversion unit receives an input magnetic field containing an input magnetic field component in a direction parallel to Z direction, and generates an output magnetic field containing an output magnetic field component in a direction parallel to X direction. The magnetic field detection unit receives the output magmetic field and generates an output signal corresponding to the input magnetic field component. The magnetic field detection unit includes first and second magnetic detection elements. When misalignment occurs between the magnetic field conversion unit and the magnetic field detection unit, one of the strength of a portion of the output magnetic field component that the first magnetic detection element receives and the strength of a portion of the output magnetic field component that the second magnetic detection element receives increases while the other decreases.

14 Claims, 19 Drawing Sheets

(56) References Cited

U.S. PATENT DOCUMENTS

2016/0282144 A1* 9/2016 Komasaki ............ H01F 7/0273
2017/0261349 A1* 9/2017 Nagata ................. G01D 5/16
2018/0180685 A1* 6/2018 Komasaki ............ H01F 7/0273

FOREIGN PATENT DOCUMENTS

| JP | 2015-118067 A | 6/2015 |
| JP | 2015-203647 A | 11/2015 |

* cited by examiner

MAGNETIC SENSOR

BACKGROUND OF THE INVENTION

1. Field of the Invention

The present invention relates to a magnetic sensor capable of detecting, through the use of a magnetic detection element, a magnetic field in a direction other than the direction to which the magnetic detection element has sensitivity.

2. Description of the Related Art

Nowadays, some mobile telecommunication devices such as mobile phones may be configured with geomagnetic sensors. It is required of the geomagnetic sensors intended for such use to be small in size and capable of detecting three-dimensional directions of an external magnetic field. Such geomagnetic sensors are implemented using magnetic sensors. Magnetic sensors provided with a plurality of magnetic detection elements on a substrate are known. The magnetic detection elements may be magnetoresistive elements, for example.

In many cases, the magnetic detection elements provided on a substrate are configured to detect a magnetic field in a direction parallel to the plane of the substrate. To implement a geomagnetic sensor using a magnetic sensor, the magnetic sensor needs to be capable of detecting a magnetic field in a direction perpendicular to the plane of the substrate.

JP 2013-032989A describes a magnetic sensor capable of detecting a magnetic field in a direction perpendicular to the plane of a substrate by using a magnetoresistive element configured to detect a magnetic field in a direction parallel to the plane of the substrate. The magnetic sensor includes a soft magnetic material for converting a vertical magnetic field component perpendicular to the plane of the substrate into a horizontal magnetic field component parallel to the plane of the substrate, and supplying the horizontal magnetic field component to the magnetoresistive element.

In a magnetic sensor including a magnetic detection element such as a magnetoresistive element and a soft magnetic material for converting the vertical magnetic field component into the horizontal magnetic field component, like the magnetic sensor described in JP 2013-032989A, disadvantageously, a misalignment between the magnetic detection element and the soft magnetic material can cause large variation in the efficiency of conversion from the vertical magnetic field component into the horizontal magnetic field component, thus causing large variations in output signals.

JP 2013-032989A describes a technique that enables reducing disturbance sensitivity even if an offset occurs between the soft magnetic material and the magnetoresistive element. JP 2013-032989A describes that the disturbance sensitivity refers to sensing of a disturbance magnetic field in a direction parallel to the direction of a sensitivity axis. JP 2013-032989A describes that the conventional magnetic sensor has the disturbance sensitivity even in a state that no magnetic field is applied to the magnetoresistive element. On the other hand, JP 2013-032989A gives no consideration to the fact that a misalignment between the magnetoresistive element and the soft magnetic material causes variation in the efficiency of conversion from the vertical magnetic field component into the horizontal magnetic field component. Further, preventing the variation in the aforementioned conversion efficiency caused by a misalignment between the magnetoresistive element and the soft magnetic material s difficult with the technique described in JP 2013-032989A.

SUMMARY OF THE INVENTION

It is an object of the present invention to provide a magnetic sensor capable of detecting, through the use of a magnetic detection element, a magnetic field in a direction other than the direction to which the magnetic detection element has sensitivity, and also capable of reducing or eliminating variation in an output signal caused by misalignment.

A magnetic sensor of each of a first to a third aspect of the present invention includes a magnetic field conversion unit and a magnetic field detection unit. The magnetic field conversion unit is formed of a soft magnetic material and configured to receive an input magnetic field and generate an output magnetic field, the input magnetic field containing an input magnetic field component in a direction parallel to a first virtual straight line. The magnetic field detection unit is configured to receive the output magnetic field and generate an output signal corresponding to the input magnetic field component. The output magnetic field contains an output magnetic field component in a direction parallel to a second virtual straight line intersecting the first virtual straight line. The output magnetic field component varies depending on the input magnetic field component.

In the magnetic sensor of the first aspect of the present invention, the magnetic field conversion unit has an end face located at an end in the direction parallel to the first virtual straight line. A first element-placement region and a second element-placement region lie in a virtual plane that includes the second virtual straight line and intersects the first virtual straight line. Each of the first and second element-placement regions lies only either inside or outside an end face projection region, the end face projection region being a region formed by vertically projecting the end face of the magnetic field conversion unit onto the virtual plane.

One of an inclination of a conversion efficiency at a given first point in the first element-placement region and an inclination of the conversion efficiency at a given second point in the second element-placement region has a positive value while the other has a negative value, where the conversion efficiency at a given point in the virtual plane refers to the ratio of the strength of the output magnetic field component at the given point to the strength of the input magnetic field component, and the inclination of the conversion efficiency at the given point refers to the ratio of a variation amount of the conversion efficiency at the given point to a positional variation amount of the given point when the given point is moved in one direction parallel to the second virtual straight line.

The magnetic field detection unit includes a first magnetic detection element and a second magnetic detection element each of which is configured to receive a portion of the output magnetic field component. The first magnetic detection element is disposed to intersect the first element-placement region and not to intersect the second element-placement region. The second magnetic detection element is disposed to intersect the second element-placement region and not to intersect the first element-placement region. The first magnetic detection element generates a first detection value corresponding to the portion of the output magnetic field component received by the first magnetic detection element. The second magnetic detection element generates a second detection value corresponding to the portion of the output magnetic field component received by the second magnetic detection element. The output signal depends on a composite value obtained by compositing the first detection value and the second detection value.

In the magnetic sensor of the first aspect of the present invention, each of the first and second magnetic detection elements may be shaped to be elongated in a direction parallel to a third virtual straight line that is located in the virtual plane and orthogonal to the second virtual straight line.

In the magnetic sensor of the first aspect of the present invention, the first magnetic detection element may be a first magnetoresistive element, and the second magnetic detection element may be a second magnetoresistive element. In such a case, the first detection value may be a resistance value of the first magnetoresistive element, and the second detection value may be a resistance value of the second magnetoresistive element. The composite value may be a composite resistance value of the first magnetoresistive element and the second magnetoresistive element. The first magnetoresistive element and the second magnetoresistive element may be connected in parallel or in series.

In the magnetic sensor of the first aspect of the present invention, the second virtual straight line may be orthogonal to the first virtual straight line.

The magnetic sensor of the first aspect of the present invention may further include a substrate for holding the first magnetic detection element and the second magnetic detection element.

In the magnetic sensor of the first aspect of the present invention, the ratio of the absolute value of the inclination of the conversion efficiency at a second center of gravity to the absolute value of the inclination of the conversion efficiency at a first center of gravity may be within a range of 0.48 to 2.1, where the first center of gravity refers to the center of gravity of a portion of the first element-placement region that intersects the first magnetic detection element, and the second center of gravity refers to the center of gravity of a portion of the second element-placement region that intersects the second magnetic detection element.

In the magnetic sensor of the first aspect of the present invention, the first element-placement region may lie only outside the end face projection region, and the second element-placement region may lie only inside the end face projection region. In such a case, the end face projection region may have an edge located between the first and second element-placement regions and orthogonal to the second virtual straight line.

In the magnetic sensor of the first aspect of the present invention, the magnetic field conversion unit may include a yoke. The yoke may have a yoke end face located at an end in the direction parallel to the first virtual straight line. The end face projection region may include a yoke end face projection region formed by vertically projecting the yoke end face onto the virtual plane.

In such a case, the first element-placement region and the second element-placement region may lie only outside the end face projection region, and be located on opposite sides of the yoke end face projection region in the direction parallel to the second virtual straight line.

Alternatively, the first element-placement region and the second element-placement region may lie only inside the yoke end face projection region. The yoke end face projection region may have a first edge and a second edge located at opposite ends in the direction parallel to the second virtual straight line. The first element-placement region may be located between the first edge and the second element-placement region. The second element-placement region may be located between the second edge and the first element-placement region.

In the magnetic sensor of the first aspect of the present invention, the magnetic field conversion unit may include a first yoke and a second yoke. The first yoke has a first yoke end face located at an end of the first yoke in the direction parallel to the first virtual straight line. The second yoke has a second yoke end face located at an end of the second yoke in the direction parallel to the first virtual straight line. The first element-placement region is closer to the first yoke end face than to the second yoke end face. The second element-placement region is closer to the second yoke end face than to the first yoke end face. The first yoke end face has a first edge closest to the first element-placement region. The second yoke end face has a second edge closest to the second element-placement region. One of a first distance and a second distance decreases while the other increases when the given first point in the first element-placement region and the given second point in the second element-placement region are moved in one direction parallel to the second virtual straight line, where the first distance refers to the distance between the given first point and the first edge, and the second distance refers to the distance between the given second point and the second edge.

In the magnetic sensor of the second aspect of the present invention, the magnetic field detection unit includes a first resistor section and a second resistor section each of which has a resistance value that varies depending on the input magnetic field component. The first resistor section and the second resistor section are connected in series and configured to be energized. When the input magnetic field component varies, one of the resistance value of the first resistor section and the resistance value of the second resistor section increases while the other decreases. The output signal depends on a potential at a connection point between the first resistor section and the second resistor section. Each of the first and second resistor sections includes a first magnetoresistive element and a second magnetoresistive element each of which is configured to receive a portion of the output magnetic field component.

In the magnetic sensor of the third aspect of the present invention, the magnetic field detection unit includes a power supply port, a ground port, a first output port, a second output port, a first resistor section, a second resistor section, a third resistor section, and a fourth resistor section. Each of the first to fourth resistor sections has a resistance value that varies depending on the input magnetic field component. The first resistor section is provided between the power supply port and the first output port. The second resistor section is provided between the first output port and the ground port. The third resistor section is provided between the power supply port and the second output port. The fourth resistor section is provided between the second output port and the ground port. The magnetic field detection unit is configured to be energized between the power supply port and the ground port. When the input magnetic field component varies, the resistance values of the first to fourth resistor sections vary such that the resistance values of the first and fourth resistor sections increase while the resistance values of the second and third resistor sections decrease, or such that the resistance values of the first and fourth resistor sections decrease while the resistance values of the second and third resistor sections increase. The output signal depends on a potential difference between the first output port and the second output port. Each of the first to fourth resistor sections includes a first magnetoresistive element and a second magnetoresistive element each of which is configured to receive a portion of the output magnetic field component.

In the magnetic sensor of each of the second and third aspects of the present invention, the magnetic field conversion unit has an end face located at an end in the direction parallel to the first virtual straight line. A first element-placement region and a second element-placement region lie in a virtual plane that includes the second virtual straight line and intersects the first virtual straight line. Each of the first and second element-placement regions lies only either inside or outside an end face projection region, the end face projection region being a region formed by vertically projecting the end face of the magnetic field conversion unit onto the virtual plane.

One of an inclination of a conversion efficiency at a given first point in the first element-placement region and an inclination of the conversion efficiency at a given second point in the second element-placement region has a positive value while the other has a negative value, where the conversion efficiency at a given point in the virtual plane refers to the ratio of the strength of the output magnetic field component at the given point to the strength of the input magnetic field component, and the inclination of the conversion efficiency at the given point refers to the ratio of a variation amount of the conversion efficiency at the given point to a positional variation amount of the given point when the given point is moved in one direction parallel to the second virtual straight line.

In the magnetic sensor of each of the second and third aspects of the present invention, the first magnetoresistive element is disposed to intersect the first element-placement region and not to intersect the second element-placement region. The second magnetoresistive element is disposed to intersect the second element-placement region and not to intersect the first element-placement region. The first magnetoresistive element has a first resistance value corresponding to the portion of the output magnetic field component received by the first magnetoresistive element. The second magnetoresistive element has a second resistance value corresponding to the portion of the output magnetic field component received by the second magnetoresistive element. The first magnetoresistive element and the second magnetoresistive element are connected in parallel or in series.

According to the magnetic sensor of the first aspect of the present invention, when a misalignment occurs between the magnetic field conversion unit and the magnetic field detection unit, one of the strength of the portion of the output magnetic field component that the first magnetic detection element receives and the strength of the portion of the output magnetic field component that the second magnetic detection element receives increases while the other decreases. Further, according to the magnetic sensor of each of the second and third aspects of the present invention, when a misalignment occurs between the magnetic field conversion unit and the magnetic field detection unit, one of the strength of the portion of the output magnetic field component that the first magnetoresistive element receives and the strength of the portion of the output magnetic field component that the second magnetoresistive element receives increases while the other decreases. By virtue of these features, the magnetic sensor of each of the first to third aspects of the present invention is capable of detecting, through the use of the magnetic detection elements, a magnetic field in a direction other than the direction to which the magnetic detection elements have sensitivity, and also capable of reducing or eliminating variation in the output signal caused by misalignment between the magnetic field conversion unit and the magnetic field detection unit.

Other and further objects, features and advantages of the present invention will appear more fully from the following description.

DETAILED DESCRIPTION OF THE PREFERRED EMBODIMENTS

First Embodiment

Figure 6:
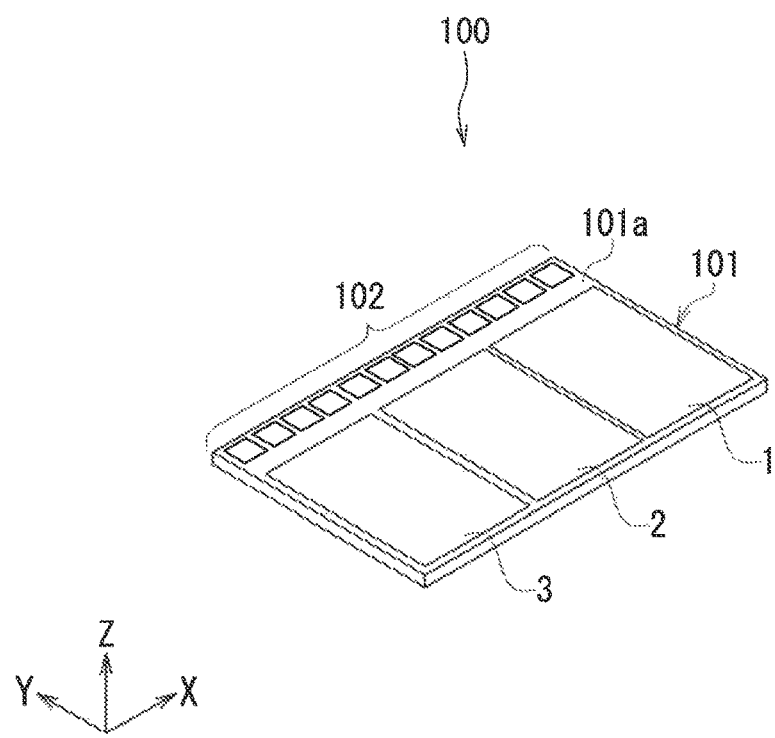
FIG. 6 is a perspective view of a magnetic sensor unit including the magnetic sensor according to the first embodiment of the invention.

Preferred embodiments of the present invention will now be described in detail with reference to the drawings. First, reference is made to FIG. 6 to describe the configuration of a magnetic sensor unit including a magnetic sensor according to a first embodiment of the invention. FIG. 6 is a perspective view of the magnetic sensor unit 100. The magnetic sensor unit 100 includes: a substrate 101 having a top surface 101a; a magnetic sensor 1 according to the first embodiment; and two magnetic sensors 2 and 3 other than the magnetic sensor 1. The magnetic sensors 1 to 3 are aligned on the top surface 101a of the substrate 101.

Now, we define X, Y and Z directions as shown in FIG. 6. The X, Y and Z directions are orthogonal to one another. In the present embodiment, the X direction is from the magnetic sensor 3 to the magnetic sensor 1, and the Z direction is a direction perpendicular to the top surface 101a of the substrate 101. Further, −X, −Y, and −Z directions refer to directions that are opposite to the X, Y, and Z directions, respectively. As used herein, the term "above" refers to positions located forward of a reference position in the Z direction, and "below" refers to positions located on a side of the reference position opposite to "above".

The magnetic sensor 1 according to the present embodiment is configured to detect a magnetic field in the Z direction. The magnetic sensor 2 is configured to detect a magnetic field in the Y direction. The magnetic sensor 3 is configured to detect a magnetic field in the X direction.

The magnetic sensor unit 100 further includes a plurality of electrode pads 102 aligned in the X direction on the top surface 101a of the substrate 101. The electrode pads 102 are electrically connected to the magnetic sensors 1 to 3.

Figure 1:
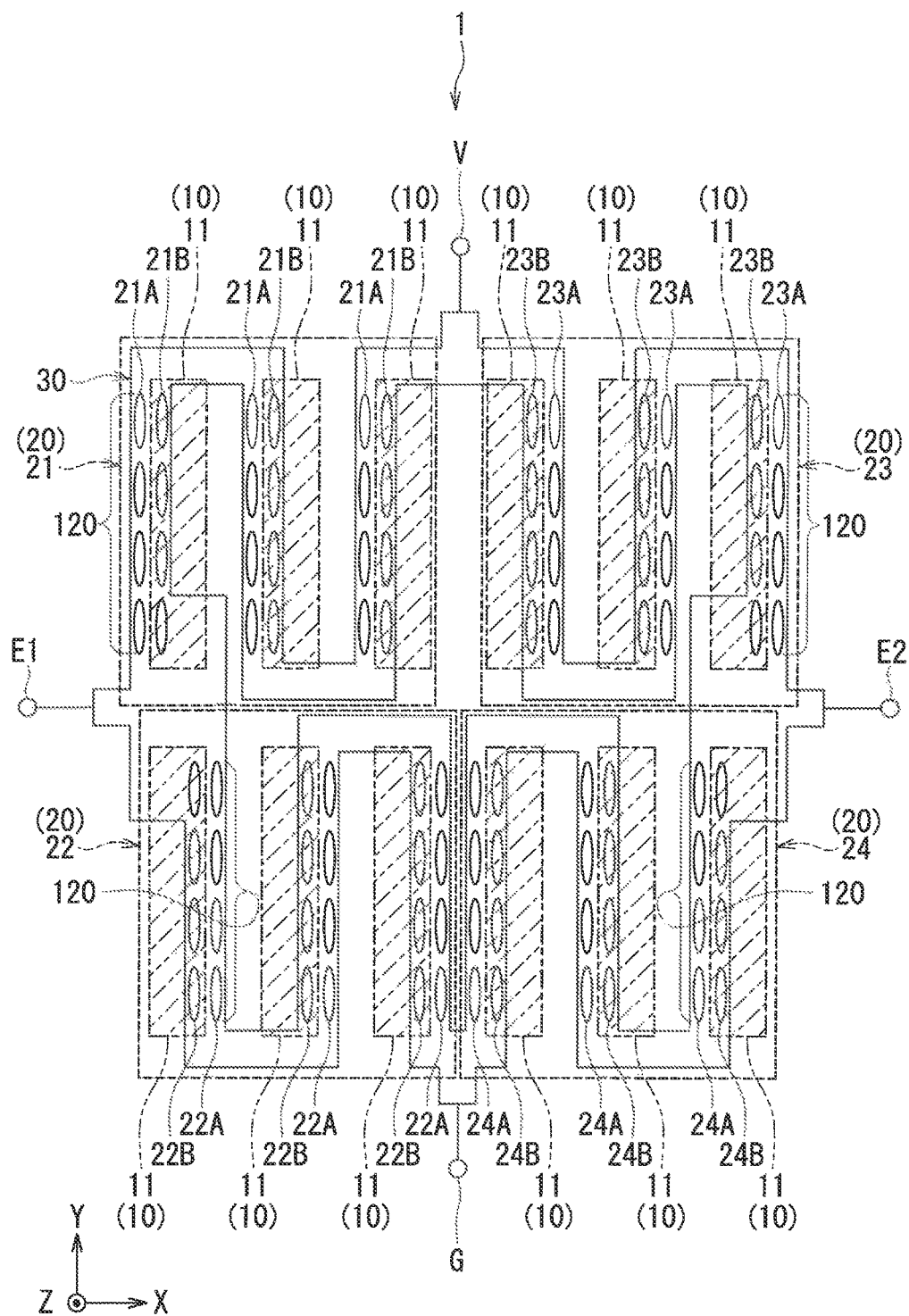
FIG. 1 is an explanatory diagram schematically illustrating the configuration of a magnetic sensor according to a first embodiment of the invention.
Figure 2:
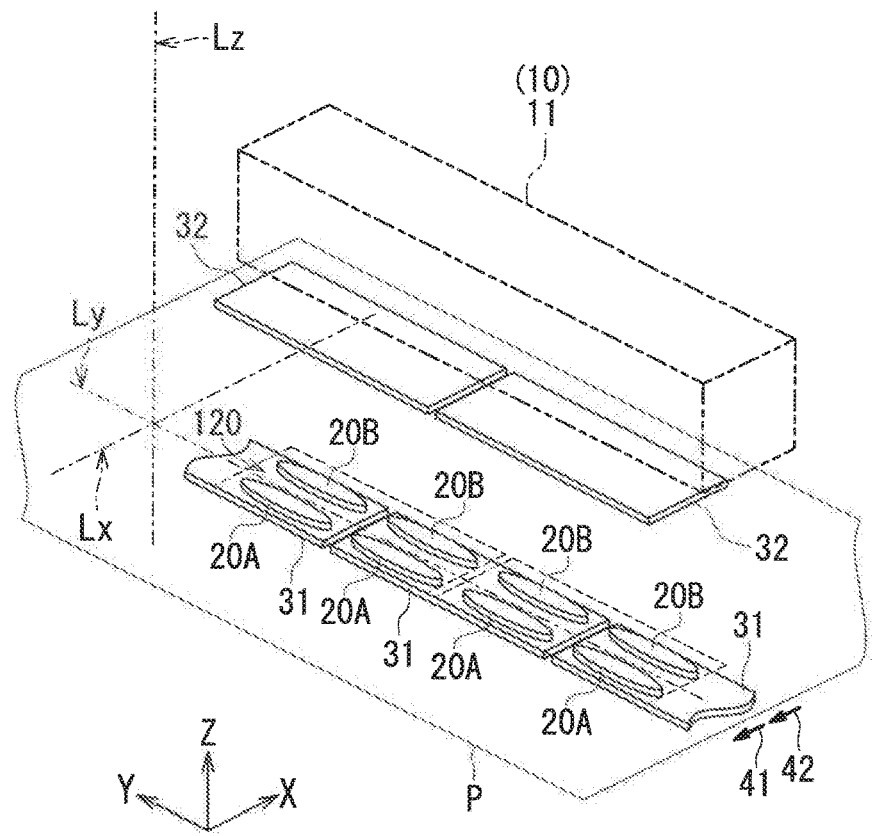
FIG. 2 is a partial, exploded perspective view of the magnetic sensor according to the first embodiment of the invention.
Figure 3:
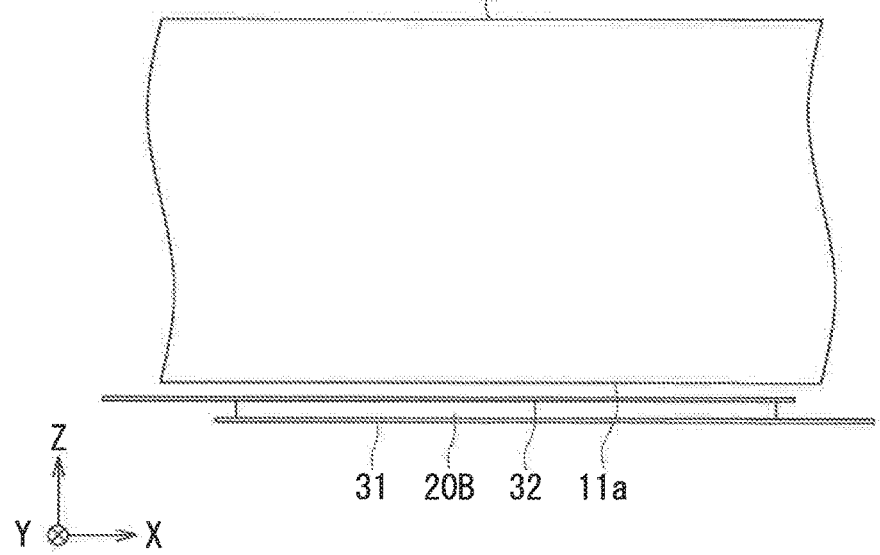
FIG. 3 is a partial side view of the magnetic sensor according to the first embodiment of the invention.

Now, the configuration of the magnetic sensor 1 according to the present embodiment will be described in detail with reference to FIG. 1 to FIG. 3. FIG. 1 is an explanatory diagram schematically illustrating the configuration of the magnetic sensor 1. FIG. 2 is a partial, exploded perspective view of the magnetic sensor 1. FIG. 3 is a partial side view of the magnetic sensor 1.

Let us define a first virtual straight line Lz, a second virtual straight line Lx, a third virtual straight line Ly, and a virtual plane P as follows. As shown in FIG. 2, the first virtual straight line Lz is a straight line parallel to the Z direction. The second virtual straight line Lx is a straight line intersecting the first virtual straight line Lz. In the present embodiment, in particular, the second virtual straight line Lx is parallel to the X direction and orthogonal to the first virtual straight line Lz. The virtual plane P is a plane including the second virtual straight line Lx and intersecting the first virtual straight line Lz. In the present embodiment, the virtual plane P is the XY plane, in particular. The third virtual straight line Ly is a straight line located in the virtual plane P and orthogonal to the second virtual straight line Lx. In the present embodiment, the third virtual straight line Ly is parallel to the Y direction, in particular.

Directions parallel to the first virtual straight line Lz include the Z direction and the −Z direction. Directions parallel to the second virtual straight line Lx include the X direction and the −X direction. Directions parallel to the third virtual straight line Ly include the Y direction and the −Y direction.

As shown in FIG. 1 and FIG. 2, the magnetic sensor 1 includes a magnetic field conversion unit 10 and a magnetic field detection unit 20. The magnetic field conversion unit 10 is formed of a soft magnetic material, and configured to receive an input magnetic field and generate an output magnetic field. The input magnetic field contains an input magnetic field component in a direction parallel to the first virtual straight line Lz. The magnetic field detection unit 20 is configured to receive the output magnetic field and generate an output signal corresponding to the input magnetic field component. The output magnetic field contains an output magnetic field component in a direction parallel to the second virtual straight line Lx. The output magnetic field component varies depending on the input magnetic field component.

In the present embodiment, the magnetic field conversion unit 10 is an assembly of a plurality of elements separate from each other. In the present embodiment, in particular, the magnetic field conversion unit 10 includes a plurality of yokes 11 as the aforementioned plurality of elements. Each of the plurality of yokes 11 is shaped like a rectangular solid elongated in a direction parallel to the third virtual straight line Ly. The layout of the plurality of yokes 11 will be described in detail later.

As shown in FIG. 1, the magnetic field detection unit 20 includes a first resistor section 21, a second resistor section 22, a third resistor section 23 and a fourth resistor section 24 each of which has a resistance value that varies depending on the input magnetic field component. In the present embodiment, the first resistor section 21 and the third resistor section 23 are arranged in this order in the X direction. The second resistor section 22 and the fourth resistor section 24 are respectively offset from the first resistor section 21 and the third resistor section 23 in the −Y direction, and arranged in this order in the X direction.

Each of the first to fourth resistor sections 21 to 24 includes a first magnetic detection element and a second magnetic detection element each of which is configured to receive a portion of the output magnetic field component. Since the first to fourth resistor sections 21 and 24 are part of the magnetic field detection unit 20, the magnetic field detection unit 20 can be said to include the first and second magnetic detection elements. The first magnetic detection element is configured to generate a first detection value corresponding to the portion of the output magnetic field component received by the first magnetic detection element. The second magnetic detection element is configured to generate a second detection value corresponding to the portion of the output magnetic field component received by the second magnetic detection element.

In the present embodiment, the first resistor section 21 includes a plurality of first magnetic detection elements 21A and a plurality of second magnetic detection elements 21B. The second resistor section 22 includes a plurality of first magnetic detection elements 22A and a plurality of second magnetic detection elements 22B. The third resistor section 23 includes a plurality of first magnetic detection elements 23A and a plurality of second magnetic detection elements 23B. The fourth resistor section 24 includes a plurality of first magnetic detection elements 24A and a plurality of second magnetic detection elements 24B.

Hereinafter, the reference sign 20A is used to represent any of the first magnetic detection elements 21A, 22A, 23A and 24A, and the reference sign 20B is used to represent any of the second magnetic detection elements 21B, 22B, 23B and 24B. As shown in FIG. 1 and FIG. 2, each of the first and second magnetic detection elements 20A and 20B is shaped to be elongated in a direction parallel to the third virtual straight line Ly.

In the present embodiment, each of the first to fourth resistor sections 21 to 24 includes a plurality of magnetic detection element trains 120. Each magnetic detection element train 120 includes a first portion in which a plurality of first magnetic detection elements 20A are aligned in the Y direction, and a second portion in which a plurality of second magnetic field detection elements 20B are aligned in the Y direction. In each of the first to fourth resistor sections 21 to 24, the plurality of magnetic detection element trains 120 are aligned in the X direction.

In the first and fourth resistor sections 21 and 24, the first portion and the second portion of each magnetic detection element train 120 are arranged in this order in the X direction. In the second and third resistor sections 22 and 23, the first portion and the second portion of each magnetic detection element train 120 are arranged in this order in the −X direction.

The magnetic sensor 1 further includes a substrate for holding the first and second magnetic detection elements 20A and 20B, and a wiring layer 30 for establishing electrical connection between the first and second magnetic detection elements 20A and 20B. In the present embodiment, the substrate 101 shown in FIG. 6 also serves as the abovementioned substrate of the magnetic sensor 1. As shown in FIG. 1, the general shape of the wiring layer 30 is meandering when viewed in the Z direction. The wiring layer 30 includes a plurality of lower electrodes 31 and a plurality of upper electrodes 32. FIG. 1 omits the illustration of the lower electrodes 31 and the upper electrodes 32. Thus, only the general shape of the wiring layer 30 is shown in FIG. 1.

The lower electrodes 31 are disposed on the top surface 101a of the substrate 101 shown in FIG. 6. The first and second magnetic detection elements 20A and 20B are disposed on the lower electrodes 31. In the present embodiment, the first and second magnetic detection elements 20A and 20B are held by the substrate 101, with the lower electrodes 31 interposed between the substrate 101 and the first and second magnetic detection elements 20A and 20B.

The upper electrodes 32 are disposed on the first and second magnetic detection elements 20A and 20B. The yokes 11 are disposed above the upper electrodes 32. In FIG. 2, the yoke 11 and the upper electrode 32 are depicted as separate from the magnetic field detection elements 20A and 20B and the lower electrodes 31 in the Z direction. In FIG. 2, broken lines indicate the positions of lower surfaces of the upper electrodes 32. In any exploded perspective views that are similar to FIG. 2 and are to be referred to for descriptions below, the yokes and upper electrodes are illustrated in the same manner as FIG. 2. The connection relationships between the first and second magnetic detection elements 20A and 20B and the upper and lower electrodes 32 and 31 will be described later in detail.

Figure 4:
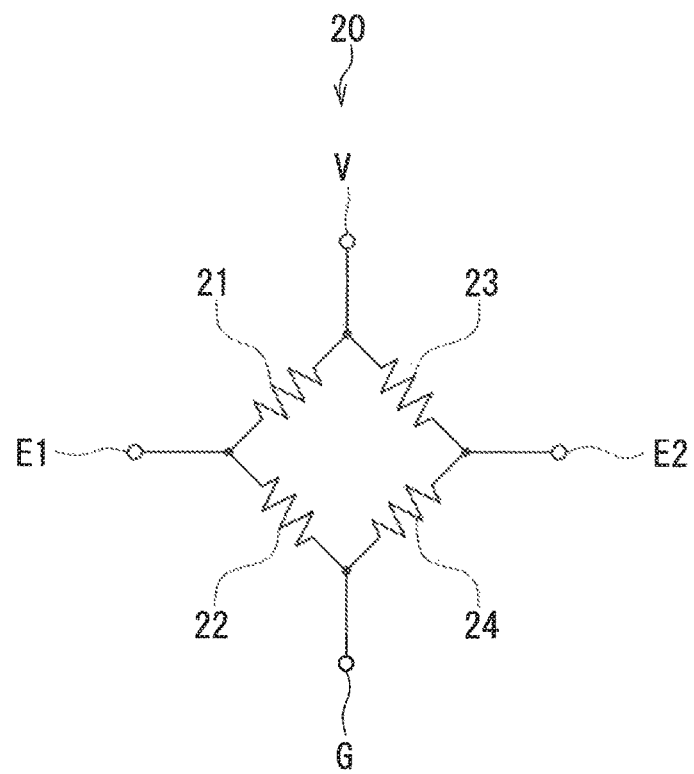
FIG. 4 is a circuit diagram illustrating the circuit configuration of a magnetic field detection unit of the first embodiment of the invention.

Reference is now made to FIG. 4 to describe the circuit configuration of the magnetic field detection unit 20. FIG. 4 is a circuit diagram illustrating the circuit configuration of the magnetic field detection unit 20. The magnetic field detection unit 20 further includes a power supply port V, a ground port G, a first output port E1, and a second output port E2. The first resistor section 21 is provided between the power supply port V and the first output port E1. The second resistor section 22 is provided between the first output port E1 and the ground port G. The third resistor section 23 is provided between the power supply port V and the second output port E2. The fourth resistor section 24 is provided between the second output port E2 and the ground port G.

The magnetic field detection unit 20 is configured to be energized between the power supply port V and the ground port G. The first resistor section 21 and the second resistor section 22 in the magnetic field detection unit 20 are connected in series and configured to be energized. The third resistor section 23 and the fourth resistor section 24 in the magnetic field detection unit 20 are also connected in series and configured to be energized. The power supply port V and the ground port G are electrically connected to two electrode pads 102 between which a power supply voltage of a predetermined magnitude is applied, among the plurality of electrode pads 102 shown in FIG. 6. Note that the first and second output ports E1 and E2 are electrically connected to other two electrode pads 102 of the plurality of electrode pads 102. As will be described later, the magnetic field detection unit 20 generates a signal that depends on the potential difference between the first output port E1 and the second output port E2, as the output signal. The output signal depends on the potential at the first output port E1, which is the connection point between the first resistor section 21 and the second resistor section 22, and also depends on the potential at the second output port E2, which is the connection point between the third resistor section 23 and the fourth resistor section 24.

Reference is now made to FIG. 2 to describe the connection relationships between the first and second magnetic detection elements 20A and 20B and the upper and lower electrodes 32 and 31. In the present embodiment, the first magnetic detection element 20A is a first magnetoresistive element, and the second magnetic detection element 20B is a second magnetoresistive element. Hereinafter, the first magnetic detection element 20A will also be referred to as the first magnetoresistive element 20A, and the second magnetic detection element 20B will also be referred to as the second magnetoresistive element 20B. Here, by way of example, one of the magnetic detection element trains 120 of the first or fourth resistor section 21 or 24 will be described. FIG. 2 illustrates one of the magnetic detection element trains 120 of the first or fourth resistor section 21 or 24.

As shown in FIG. 2, each lower electrode 31 is shaped to be elongated in the Y direction. A gap is formed between every two lower electrodes 31 adjacent in the Y direction. A pair of first and second magnetoresistive elements 20A and 20B adjacent in the X direction are disposed on a portion of the top surface of each lower electrode 31 near each of opposite ends in the Y direction. Such a pair of first and second magnetoresistive elements 20A and 20B will hereinafter be referred to as an element pair. In the first and fourth resistor sections 21 and 24, the first and second magnetoresistive elements 20A and 20B constituting each single element pair are arranged in this order in the X direction.

Each upper electrode 32 establishes electrical connection between the first and second magnetoresistive elements 20A and 20B constituting a single element pair. The first and second magnetoresistive elements 20A and 20B constituting each single element pair are thereby connected in parallel. Each upper electrode 32 further establishes electrical connection between two adjacent element pairs that are disposed on two lower electrodes 31 adjacent in the Y direction. A plurality of element pairs are thereby connected in series.

In each magnetic detection element train 120 of the second or third resistor section 22 or 23, the connection relationships between the first and second magnetic detection elements 20A and 20B and the upper and lower electrodes 32 and 31 are basically the same as those described above with reference to FIG. 2. However, in the second and third resistor sections 22 and 23, the first and second magnetoresistive elements 20A and 20B constituting each single element pair are arranged in this order in the −X direction.

The wiring layer 30 further includes a plurality of connection electrodes. The plurality of connection electrodes electrically connect the lower electrodes 31 so that the plurality of magnetic detection element trains 120 are connected in series in each of the first to fourth resistor sections 21 to 24. Such a configuration allows each of the first to fourth resistor sections 21 to 24 to include a plurality of element pairs connected in series.

Figure 5:
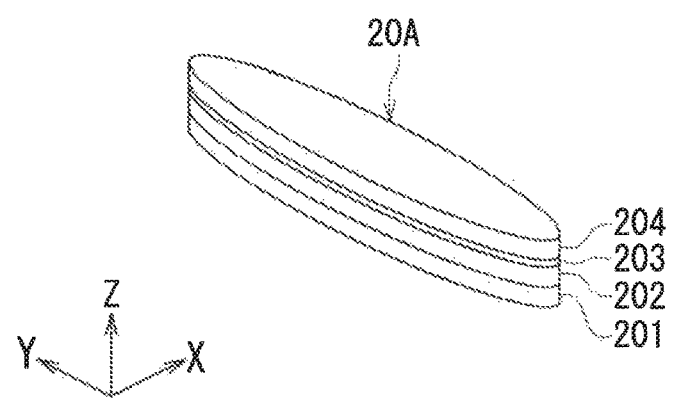
FIG. 5 is a perspective view of a first magnetoresistive element of the first embodiment of the invention.

An example of configuration of the first and second magnetoresistive elements 20A and 20B will now be described with reference to FIG. 2 to FIG. 5. FIG. 5 is a perspective view of the first magnetoresistive element 20A. In this example, the first magnetoresistive element 20A includes a magnetization pinned layer 202 whose magnetization direction is pinned, a free layer 204 which is a magnetic layer whose magnetization direction varies according to the direction and strength of the output magnetic field component, a nonmagnetic layer 203 between the magnetization pinned layer 202 and the free layer 204, and an antiferromagnetic layer 201. The antiferromagnetic layer 201, the magnetization pinned layer 202, the nonmagnetic layer 203, and the free layer 204 are stacked in this order, the antiferromagnetic layer 201 being closest to the lower electrode 31. The antiferromagnetic layer 201 is formed of an antiferromagnetic material. The antiferromagnetic layer 201 is in exchange coupling with the magnetization pinned layer 202 so as to pin the magnetization direction of the magnetization pinned layer 202.

The first magnetoresistive element 20A may be a TMR element or a GMR element. In the TMR element, the nonmagnetic layer 203 is a tunnel barrier layer. In the GMR element, the nonmagnetic layer 203 is a nonmagnetic conductive layer.

The first magnetoresistive element 20A has a first resistance value corresponding to the portion of the output magnetic field component received by the first magnetoresistive element 20A. The first resistance value varies according to the angle that the magnetization direction of the free layer 204 forms with respect to the magnetization direction of the magnetization pinned layer 202. The first resistance value is minimized when the foregoing angle is 0°, and maximized when the foregoing angle is 180°.

The second magnetoresistive element 20B has the same configuration as the first magnetoresistive element 20A. Thus, in the following description, components of the second magnetoresistive element 20B are denoted by the same reference signs as those used for the components of the first magnetoresistive element 20A. The second magnetoresistive element 20B has a second resistance value corresponding to the portion of the output magnetic field component received by the second magnetoresistive element 2013. The second resistance value varies according to the angle that the magnetization direction of the free layer 204 forms with respect to the magnetization direction of the magnetization pinned layer 202. The second resistance value is minimized when the foregoing angle is 0°, and maximized when the foregoing angle is 180°.

In the present embodiment, the magnetization pinned layer 202 of the first magnetoresistive element 20A and the magnetization pinned layer 202 of the second magnetoresistive element 20B are both magnetized in the −X direction. In FIG. 2, the arrow 41 indicates the magnetization direction of the magnetization pinned layer 202 of the first magnetoresistive element 20A, and the arrow 42 indicates the magnetization direction of the magnetization pinned layer 202 of the second magnetoresistive element 20B.

In the present embodiment, as previously mentioned, each of the first and second magnetoresistive elements 20A and 20B is shaped to be elongated in a direction parallel to the third virtual straight line Ly. This causes the free layer 204 of each of the first and second magnetoresistive elements 20A and 20B to have a shape anisotropy that establishes an easy axis direction parallel to the third virtual straight line Ly. Thus, when the output magnetic field component is absent, the magnetization direction of the free layer 204 of each of the first and second magnetoresistive elements 20A and 20B is parallel to the third virtual straight line Ly. When the output magnetic field component is present, the magnetization direction of the free layer 204 varies according to the direction and strength of the output magnetic field component. Thus, in each of the first and second magnetoresistive elements 20A and 20B, the angle that the magnetization direction of the free layer 204 forms with respect to the magnetization direction of the magnetization pinned layer 202 varies according to the direction and strength of the portion of the output magnetic field component received by the first or second magnetoresistive element 20A or 20B. Thus, each of the first and second resistance values corresponds to the output magnetic field component.

In the present embodiment, the respective portions of the output magnetic field component that the first and second magnetoresistive elements 20A and 20B constituting each single element pair receive are in the same direction. The portions of the output magnetic field component that the first and second magnetoresistive elements 24A and 24B of the fourth resistor section 24 receive are in the same direction as the portions of the output magnetic field component that the first and second magnetoresistive elements 21A and 21B of the first resistor section 21 receive. On the other hand, the portions of the output magnetic field component that the first and second magnetoresistive elements 22A and 22B of the second resistor section 22 receive and the portions of the output magnetic field component that the first and second magnetoresistive elements 23A and 23B of the third resistor section 23 receive are in the opposite direction to the direction of the portions of the output magnetic field component that the first and second magnetoresistive elements 21A and 21B of the first resistor section 21 receive.

Here, the first resistance value of the first magnetoresistive element 20A will be represented by the symbol Ra, and the second resistance value of the second magnetoresistive element 20B will be represented by the symbol Rb. A composite resistance value of the first and second magnetoresistive elements 20A and 20B constituting each single element pair will be represented by the symbol Rc. The composite resistance value Rc is represented as RaRb/(Ra+Rb). The resistance value of each of the first to fourth resistor sections 21 to 24 is represented as nRc=nRaRb/(Ra+Rb), where n represents the number of element pairs included in a relevant one of the first to fourth resistor sections 21 to 24.

The first resistance value Ra corresponds to the first detection value of the first magnetic detection element 20A. The second resistance value Rb corresponds to the second detection value of the second magnetic detection element 20B. The composite resistance value Rc corresponds to the composite value described previously. As will be described later, a variation in the input magnetic field component varies the first and second resistance values Ra and Rb and the composite resistance value Rc, and consequently varies the respective resistance values of the first to fourth resistor sections 21 to 24.

Possible configurations of the first and second magnetoresistive elements 20A and 20B are not limited to the example described with reference to FIG. 2 to FIG. 5. For example, each of the first and second magnetoresistive elements 20A and 20B may be configured without the antiferromagnetic layer 201. In such a case, for example, the antiferromagnetic layer 201 and the magnetization pinned layer 202 may be replaced with a magnetization pinned layer having an artificial antiferromagnetic structure including two ferromagnetic layers and a nonmagnetic metal material between the two ferromagnetic layers. The first and second magnetic detection elements 20A and 20B may be elements for detecting a magnetic field other than magnetoresistive elements, such as Hall elements and magnetic impedance elements.

Figure 7:
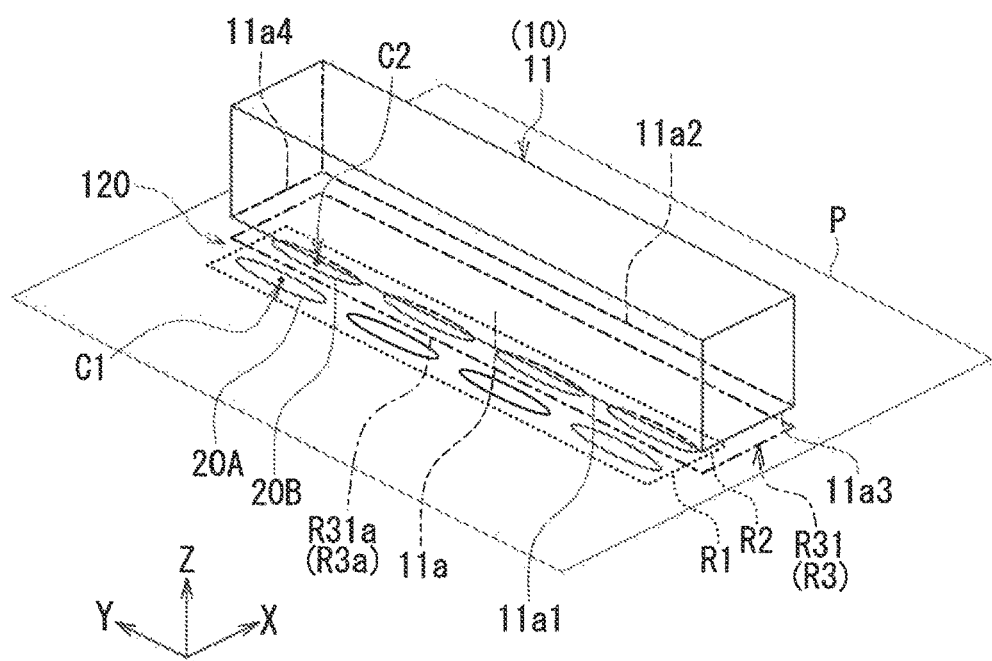
FIG. 7 is an explanatory diagram illustrating the positional relationship between a yoke and first and second magnetic detection elements in the first embodiment of the invention.

Now, a description will be given of the positional relationship between a yoke 11 and the first and second magnetic detection elements 20A and 20B. First, with reference to FIG. 7, a first element-placement region defining the position of the first magnetic detection element 20A and a second element-placement region defining the position of the second magnetic detection element 20B will be described. FIG. 7 is an explanatory diagram illustrating the positional relationship between a yoke 11 and the first and second magnetic detection elements 20A and 20B. In FIG. 7, the reference character P represents the virtual plane mentioned previously. The virtual plane P is located to intersect the first and second magnetic detection elements 20A and 20B. The first element-placement region R1 and the second element-placement region R2 lie in the virtual plane P.

The magnetic field conversion unit 10 has an end face located at an end in a direction parallel to the first virtual straight line Lz. In the present embodiment, the end face of the magnetic field conversion unit 10 is located at the end in the −Z direction. Further, as previously mentioned, the magnetic field conversion unit 10 is an assembly of a plurality of yokes 11, which are a plurality of elements separate from each other. The end face of the magnetic field conversion unit 10 includes a plurality of partial end faces separate from each other. The partial end faces are respective end faces of the plurality of yokes 11 that are located at respective ends of the yokes 11 in the −Z direction.

FIG. 7 illustrates an end face projection region R3, which is a region formed by vertically projecting the end face of the magnetic field conversion unit 10 onto the virtual plane P. Although not illustrated, the end face projection region R3 includes a plurality of partial regions formed by vertically projecting the partial end faces onto the virtual plane P. Each of the first and second element-placement regions R1 and R2 lies only inside or outside the end face projection region R3. In the present embodiment, the first element-placement region R1 lies only outside the end face projection region R3. The second element-placement region R2 lies only inside the end face projection region R3. Each of the first and second element-placement regions R1 and R2 does not lie across the border between the inside and the outside of the end face projection region R3.

As shown in FIG. 7, the first magnetic detection element 20A is disposed to intersect the first element-placement region R1 and not to intersect the second element-placement region R2. The second magnetic detection element 20B is disposed to intersect the second element-placement region R2 and not to intersect the first element-placement region R1.

In the present embodiment, the end face projection region R3 has an edge R3a located between the first and second element-placement regions R1 and R2 and orthogonal to the second virtual straight line Lx. In the present embodiment, the first element-placement region R1 and the second element-placement region R2 are in contact with each other. The edge R3a of the end face projection region R3 coincides with the border between the first element-placement region R1 and the second element-placement region R2.

Now, a description will be given of the positional relationship between one yoke 11 and the first and second element-placement regions R1 and R2. As shown in FIG. 1, when viewed from the Z direction, the plurality of yokes 11 of the magnetic field conversion unit 10 are disposed to overlap the second portions (the plurality of second magnetoresistive elements 20B) of the plurality of magnetic detection element trains 120 of the first to fourth resistor sections 21 to 24. Here, by way of example, one yoke 11 that overlaps one magnetic detection element train 120 of the first or fourth resistor section 21 or 24 will be described. FIG. 7 shows the magnetic detection element train 120 of the first or fourth resistor section 21 or 24 and the yoke 11.

As shown in FIG. 7, the yoke 11 has a yoke end face 11a located at an end in a direction parallel to the first virtual straight line Lz. In the present embodiment, the yoke end face 11a is located at the end of the yoke 11 in the −Z direction. The yoke end face 11a is one of the aforementioned plurality of partial end faces. The end face projection region R3 includes a yoke end face projection region R31 formed by vertically projecting the yoke end face 11a onto the virtual plane P. The yoke end face projection region R31 corresponding to the yoke end face 11a shown in FIG. 7 is one of the aforementioned plurality of partial regions of the end face projection region R3. As shown FIG. 7, the first element-placement region R1 lies only outside the yoke end face projection region R31. The second element-placement region R2 lies only inside the yoke end face projection region R31.

The yoke end face 11a has a first edge 11a1 and a second edge 11a2 located at opposite ends in a direction parallel to the second virtual straight line Lx, and has a third edge 11a3 and a fourth edge 11a4 located at opposite ends in a direction parallel to the third virtual straight line Ly. In the yoke 11 that overlaps one magnetic detection element train 120 of the first or fourth resistor section 21 or 24, the first edge 11a1 is located at the end of the yoke end face 11a in the −X direction, the second edge 11a2 is located at the end of the yoke end face 11a in the X direction, the third edge 11a3 is located at the end of the yoke end face 11a in the −Y direction, and the fourth edge 11a4 is located at the end of the yoke end face 11a in the Y direction.

The yoke end face projection region R31 has a first edge R31a orthogonal to the second virtual straight line Lx. The first edge R31a is an edge formed by vertically projecting the first edge 11a1 of the yoke end face 11a onto the virtual plane P. In the present embodiment, the first edge R31a coincides with the edge R3a of the end face projection region R3.

The positional relationship between the yoke 11 that overlaps one magnetic detection element train 120 of the second or third resistor section 22 or 23 and the first and second magnetic detection elements 20A and 20B of the second or third resistor section 22 or 23 is basically the same as the foregoing positional relationship described with reference to FIG. 7. However, in the yoke 11 that overlaps one magnetic detection element train 120 of the second or third resistor section 22 or 23, the first edge 11a1 is located at the end of the yoke end face 11a in the X direction, while the second edge 11a2 is located at the end of the yoke end face 11a in the −X direction.

Figure 8:
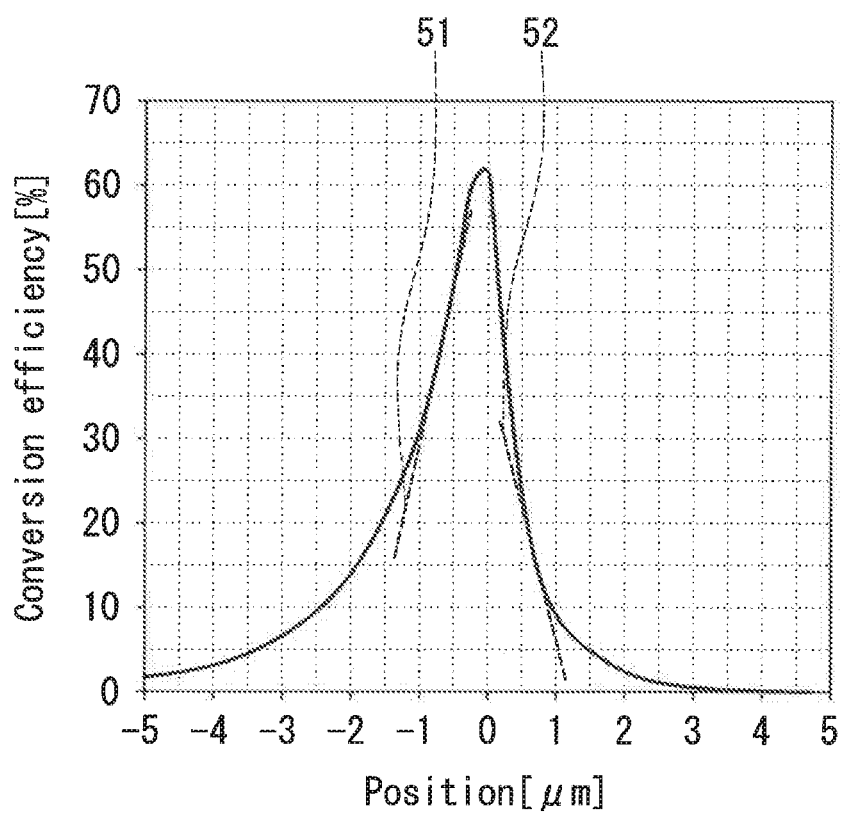
FIG. 8 is a characteristic diagram illustrating an example of the relationship between position on a second virtual straight line and conversion efficiency in the first embodiment of the invention.

Now, the first element-placement region R1 and the second element-placement region R2 will be described in further detail. As used herein, conversion efficiency at a given point in the virtual plane P refers to the ratio of the strength of the output magnetic field component at the given point to the strength of the input magnetic field component. FIG. 8 is a characteristic diagram illustrating an example of the relationship between position on the second virtual straight line Lx and the conversion efficiency. FIG. 8 particularly illustrates the conversion efficiency for the yoke 11 that overlaps one magnetic detection element train 120 of the first or fourth resistor section 21 or 24. In FIG. 8, the horizontal axis represents position on the second virtual straight line Lx, and the vertical axis represents conversion efficiency. The origin point of the horizontal axis of FIG. 8 is the point of intersection of the second virtual straight line Lx and the first edge R31a (see FIG. 7) of the yoke end face projection region R31. In FIG. 8, any position located forward of the origin point in the −X direction is expressed in a negative value, and any position located forward of the origin point in the X direction is expressed in a positive value.

As used herein, inclination of the conversion efficiency at a given point refers to the ratio of a variation amount of the conversion efficiency at the given point to a positional variation amount of the given point when the given point is moved in one direction parallel to the second virtual straight line Lx. One of the inclination of the conversion efficiency at a given first point in the first element-placement region R1 and the inclination of the conversion efficiency at a given second point in the second element-placement region R2 has a positive value while the other has a negative value. In FIG. 8, the broken line labeled 51 represents the inclination of the conversion efficiency at a given point in the first element-placement region R1, and the broken line labeled 52 represents the inclination of the conversion efficiency at a given point in the second element-placement region R2. In the present embodiment, the aforementioned one direction parallel to the second virtual straight line Lx is the X direction. In this case, the inclination of the conversion efficiency at a given first point in the first element-placement region R1 (for example, the inclination of the broken line 51) has a positive value, while the inclination of the conversion efficiency at a given second point in the second element-placement region R2 (for example, the inclination of the broken line 52) has a negative value.

FIG. 7 shows a first center of gravity C1 and a second center of gravity C2. The first center of gravity refers to the center of gravity of a portion of the first element-placement region R1 that intersects the first magnetic detection element 20A, and the second center of gravity refers to the center of gravity of a portion of the second element-placement region R2 that intersects the second magnetic detection element 20B. The ratio of the absolute value of the inclination of the conversion efficiency at the second center of gravity C2 to the absolute value of the inclination of the conversion efficiency at the first center of gravity C1 is preferably within the range of 0.48 to 2.1.

As shown in FIG. 8, the conversion efficiency is maximized in the vicinity of the origin point of the horizontal axis. As mentioned above, the origin point of the horizontal axis is the point of intersection of the second virtual straight line Lx and the first edge R31a of the yoke end face projection region R31. The first edge R31a is an edge formed by vertically projecting the first edge 11a1 of the yoke end face 11a onto the virtual plane P. FIG. 8 indicates that the conversion efficiency at a given point near the yoke 11 in the virtual plane P increases with a decrease in the distance between the given point and the first edge 11a1, and decreases with an increase in the aforementioned distance.

Now, a description will be given of the resistance values of the first to fourth resistor sections 21 to 24 and the output signal to be generated by the magnetic field detection unit 20. In the present embodiment, when no output magnetic field component is present, the magnetization direction of the free layer 204 of each of the first and second magnetoresistive elements 20A and 20B is parallel to the third virtual straight line Ly. When the input magnetic field component is in the Z direction, the portions of the output magnetic field component that the first and second magnetoresistive elements 20A and 20B of the first and fourth resistor sections 21 and 24 receive are in the X direction, whereas the portions of the output magnetic field component that the first and second magnetoresistive elements 20A and 20B of the second and third resistor sections 22 and 23 receive are in the −X direction. In this case, the magnetization direction of the free layer 204 of each of the first and second magnetoresistive elements 20A and 20B in the first and fourth resistor sections 21 and 24 is inclined from the direction parallel to the third virtual straight line Ly toward the X direction. As a result, as compared to the case where no output magnetic field component is present, the first and second resistance values Ra and Rb increase, and hence the resistance values of the first and fourth resistor sections 21 and 24 also increase. The magnetization direction of the free layer 204 of each of the first and second magnetoresistive elements 20A and 20B in the second and third resistor sections 22 and 23 is inclined from the direction parallel to the third virtual straight line Ly toward the −X direction. As a result, as compared to the case where no output magnetic field component is present, the first and second resistance values Ra and Rb decrease, and hence the resistance values of the second and third resistor sections 22 and 23 also decrease.

When the input magnetic field component is in the −Z direction, the directions of the portions of the output magnetic field component and the variations in the resistance values of the first to fourth resistor sections 21 to 24 are opposite to those in the foregoing case in which the input magnetic field component is in the Z direction.

The variation amounts of first and second resistance values Ra and Rb depend on the strengths of the respective portions of the output magnetic field component that the first and second magnetoresistive elements 20A and 20B receive. The first and second resistance values Ra and Rb increase or decrease by a larger amount with increasing strengths of the respective portions of the output magnetic field component. The first and second resistance values Ra and Rb increase or decrease by a smaller amount with decreasing strengths of the respective portions of the output magnetic field component. The strength of the output magnetic field component depends on the strength of the input magnetic field component.

As described above, when the direction and strength of the input magnetic field component vary, the resistance values of the first to fourth resistor sections 21 to 24 vary such that the resistance values of the first and fourth resistor sections 21 and 24 increase while the resistance values of the second and third resistor sections 22 and 23 decrease, or such that the resistance values of the first and fourth resistor sections 21 and 24 decrease while the resistance values of the second and third resistor sections 22 and 23 increase. This varies the potential difference between the first output port E1 and the second output port E2 shown in FIG. 4. The magnetic field detection unit 20 generates a signal that depends on the potential difference between the first output port E1 and the second output port E2, as an output signal.

When the first and second resistance values Ra and Rb vary as described above, the composite resistance value Rc also varies. Since the respective resistance values of the first to fourth resistor sections 21 to 24 depend on the composite resistance value Rc, the output signal also depends on the composite resistance value Rc.

The function and effects of the magnetic sensor 1 according to the present embodiment will now be described. First, a description will be given of a magnetic sensor of a comparative example. The magnetic sensor of the comparative example includes a plurality of magnetic detection elements connected in series, in place of the first and second magnetic detection elements 20A and 20B of the present embodiment. In the comparative example, all the magnetic detection elements extend across the border between the inside and the outside of the end face projection region R3, thus intersecting the edge R3a (see FIG. 7) of the end face projection region R3.

In the comparative example, all the magnetic detection elements are disposed such that, for example, the center of gravity of a portion of the virtual plane P that intersects the magnetic detection element coincides with the edge R3a of the end face projection region R3 in design. In such a case, if misalignment occurs between the magnetic field conversion unit 10 and the magnetic field detection unit 20, the aforementioned center of gravity deviates from the edge R3a of the end face projection region R3. When the conversion efficiency for the yoke 11 is as shown in FIG. 8, a deviation of the aforementioned center of gravity by 0.5 µm in the −X direction causes a reduction of the conversion efficiency by approximately 15%. Thus, in the magnetic sensor of the comparative example, a misalignment between the magnetic field conversion unit 10 and the magnetic field detection unit 20 largely varies the conversion efficiency, thus causing large variation in the output signal.

In contrast, in the present embodiment, the first magnetic detection element 20A is disposed to intersect the first element-placement region R1 and not to intersect the second element-placement region R2. The second magnetic detection element 20B is disposed to intersect the second element-placement region R2 and not to intersect the first element-placement region R1. Each of the first and second element-placement regions R1 and R2 lies only either inside or outside the end face projection region R3. In the present embodiment, in particular, the first element-placement region R1 lies only outside the end face projection region R3, and the second element-placement region R2 lies only inside the end face projection region R3.

Here, assume that the first center of gravity C1 shown in FIG. 7 is a first point in the first element-placement region R1, and the second center of gravity C2 shown in FIG. 7 is a second point in the second element-placement region R2. The distance between the first point and the first edge 11a1 of the yoke end face 11a of the yoke 11 is referred to as a first distance, and the distance between the second point and the first edge 11a1 is referred to as a second distance. When a misalignment occurs between the magnetic field conversion unit 10 and the magnetic field detection unit 20, the first distance and the second distance vary.

When the first point and the second point are moved in one direction parallel to the second virtual straight line Lx, one of the first and second distances decreases while the other increases. A decrease in the first distance causes an increase in the conversion efficiency at the first point, thus causing an increase in the strength of the output magnetic field component at the first point. An increase in the first distance causes a decrease in the conversion efficiency at the first point, thus causing a decrease in the strength of the output magnetic field component at the first point. A decrease in the second distance causes an increase in the conversion efficiency at the second point, thus causing an increase in the strength of the output magnetic field component at the second point. An increase in the second distance causes a decrease in the conversion efficiency at the second point, thus causing a decrease in the strength of the output magnetic field component at the second point.

For example, in the first and fourth resistor sections 21 and 24, moving the first and second points in the X direction decreases the first distance and increases the second distance. As a result, the conversion efficiency and the strength of the output magnetic field component at the first point increase, whereas the conversion efficiency and the strength of the output magnetic field component at the second point decrease. On the other hand, moving the first and second points in the −X direction increases the first distance and decreases the second distance. As a result, the conversion efficiency and the strength of the output magnetic field component at the first point decrease, whereas the conversion efficiency and the strength of the output magnetic field component at the second point increase. In either case, when each of the first and fourth resistor sections 21 and 24 is viewed as a whole, variations in the conversion efficiency and strength of the output magnetic field component caused by misalignment are smaller than in the comparative example. As a result, variations in the resistance values of the first and fourth resistor sections 21 and 24 caused by misalignment are also smaller than in the comparative example.

The above description regarding the first and fourth resistor sections 21 and 24 holds true for the second and third resistor sections 22 and 23. In the second and third resistor sections 22 and 23, moving the first and second points in the X direction increases the first distance and decreases the second distance. On the other hand, moving the first and second points in the -X direction decreases the first distance and increases the second distance.

By virtue of the foregoing, the present embodiment reduces or eliminates variations in the output signal caused by misalignment.

To decrease variations in the resistance values of the first to fourth resistor sections 21 to 24 caused by misalignment, it is preferred that the inclination of the conversion efficiency at the first center of gravity C1 and the inclination of the conversion efficiency at the second center of gravity C2 have absolute values close to each other. From this viewpoint, the ratio of the absolute value of the inclination of the conversion efficiency at the second center of gravity C2 to the absolute value of the inclination of the conversion efficiency at the first center of gravity C1 is preferably within the range of 0.83 to 1.20.

Now, a description will be given of the reason why it is difficult with the technique disclosed in JP 2013-032989A to reduce variation in the conversion efficiency caused by misalignment between the magnetoresistive elements and the soft magnetic material. In JP 2013-032989A, every magnetoresistive element is disposed such that the center of the magnetoresistive element is located outside an end face projection region of the soft magnetic material, which corresponds to the end face projection region R3, and the magnetoresistive element as a whole lies across the border between the inside and the outside of the end face projection region of the soft magnetic material. In JP 2013-032989A, every two magnetoresistive elements are connected in series to constitute an element group. If misalignment occurs between the magnetoresistive elements and the soft magnetic material, the center of one of the two magnetoresistive elements constituting the element group gets farther from the border between the inside and the outside of the end face projection region, whereas the center of the other of the two magnetoresistive elements constituting the element group gets closer to the border between the inside and the outside of the end face projection region. In this case, the amount of decrease in the conversion efficiency is large in the magnetoresistive element whose center is farther from the border between the inside and the outside of the end face projection region, whereas the amount of increase in the conversion efficiency is small in the magnetoresistive element whose center is closer to the border between the inside and the outside of the end face projection region. For this reason, according to the technique disclosed in JP 2013-032989A, misalignment between the magnetoresistive elements and the soft magnetic material leads to a large amount of variation in the conversion efficiency in the element group.

The configuration of the magnetic sensors 2 and 3 of the magnetic sensor unit 100 shown in FIG. 6 will now be briefly described. The configuration of the magnetic sensors 2 and 3 is basically the same as that of the magnetic sensor 1 according to the present embodiment. However, the magnetic sensors 2 and 3 are configured without the magnetic field conversion unit 10. The magnetic sensor 2 is configured to detect a magnetic field in the Y direction. To be more specific, for example, in the magnetic sensor 2 the magnetization pinned layers 202 of the first and second magnetic detection elements 20A and 20B included in the first and fourth resistor sections 21 and 24 are magnetized in the Y direction, and the magnetization pinned layers 202 of the first and second magnetic detection elements 20A and 20B included in the second and third resistor sections 22 and 23 are magnetized in the -Y direction.

The magnetic sensor 3 is configured to detect a magnetic field in the X direction. To be more specific, for example, in the magnetic sensor 3 the magnetization pinned layers 202 of the first and second magnetic detection elements 20A and 20B included in the first and fourth resistor sections 21 and 24 are magnetized in the X direction, and the magnetization pinned layers 202 of the first and second magnetic detection elements 20A and 20B included in the second and third resistor sections 22 and 23 are magnetized in the -X direction.

Second Embodiment

Figure 9:
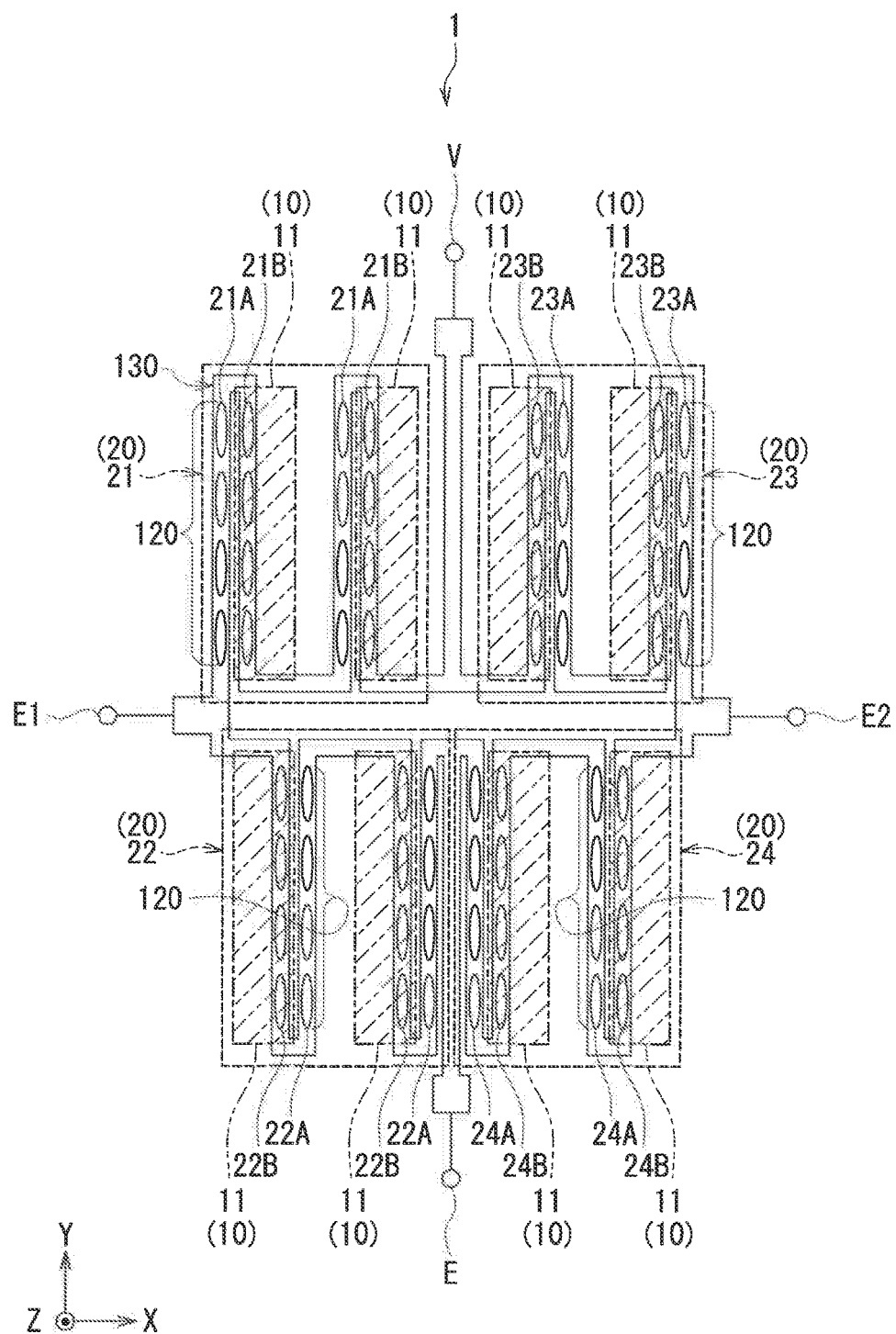
FIG. 9 is an explanatory diagram schematically illustrating the configuration of a magnetic sensor according to a second embodiment of the invention.
Figure 10:
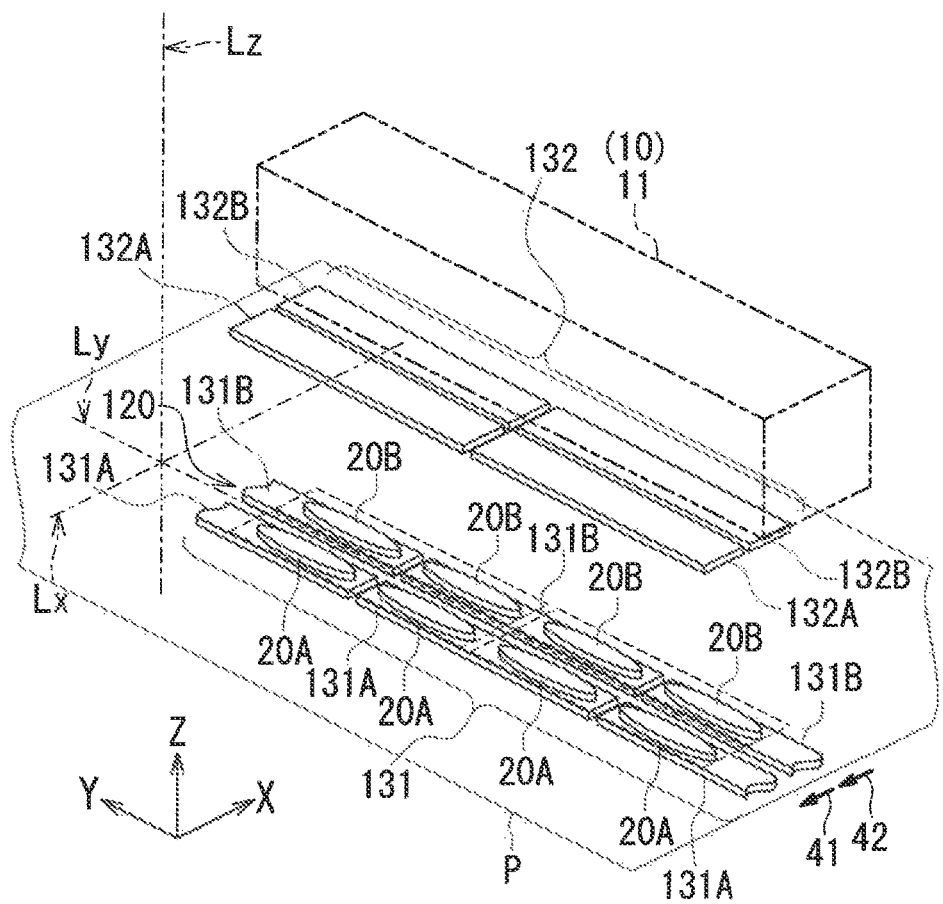
FIG. 10 is a partial, exploded perspective view of the magnetic sensor according to the second embodiment of the invention.

A second embodiment of the present invention will now be described. First, reference is made to FIG. 9 and FIG. 10 to describe the configuration of the magnetic sensor according to the second embodiment. FIG. 9 is an explanatory diagram schematically illustrating the configuration of the magnetic sensor according to the second embodiment. FIG. 10 is a partial, exploded perspective view of the magnetic sensor according to the second embodiment. The magnetic sensor 1 according to the second embodiment differs from the first embodiment in the following ways. The magnetic sensor 1 according to the second embodiment includes a wiring layer 130 in place of the wiring layer 30 of the first embodiment. The wiring layer 130 establishes electrical connection between the first and second magnetic detection elements 20A and 20B. The general shape of the wiring layer 130 is meandering when viewed in the Z direction. The wiring layer 130 includes a plurality of lower electrodes 131 and a plurality of upper electrodes 132. FIG. 9 omits the illustration of the lower electrodes 131 and the upper electrodes 132. Thus, only the general shape of the wiring layer 130 is shown in FIG. 9.

The lower electrodes 131 are disposed on the top surface 101a of the substrate 101 of the first embodiment shown in FIG. 6. In the present embodiment, the first and second magnetic detection elements 20A and 20B are disposed on the lower electrodes 131. The upper electrodes 132 are disposed on the first and second magnetic detection elements 20A and 20B. In the present embodiment, the yokes 11 are disposed above the upper electrodes 132.

In the present embodiment, the first magnetic detection element 20A is a first magnetoresistive element, and the second magnetic detection element 20B is a second magnetoresistive element. Hereinafter, the first magnetic detection element 20A will also be referred to as the first magnetoresistive element 20A, and the second magnetic detection element 20B will also be referred to as the second magnetoresistive element 20B. The connection relationships between the first and second magnetic detection elements 20A and 20B and the upper and lower electrodes 132 and 131 will now be described. Here, by way of example, one of the magnetic detection element trains 120 of the first or fourth resistor section 21 or 24 will be described. FIG. 10 illustrates one of the magnetic detection element trains 120 of the first or fourth resistor section 21 or 24.

As shown in FIG. 10, the plurality of lower electrodes 131 include a plurality of first electrodes 131A and a plurality of second electrodes 131B. Each of the first and second electrodes 131A and 131B is shaped to be elongated in the Y direction. A gap is formed between every two first electrodes 131A adjacent in the Y direction. Two first magnetoresistive elements 20A are disposed on portions of the top surface of each first electrode 131A near opposite ends in the Y direction. A gap is formed between every two second electrodes 131B adjacent in the Y direction. Two second magnetoresistive elements 20B are disposed on portions of the top surface of each second electrode 131B near opposite ends in the Y direction.

As shown in FIG. 10, the plurality of upper electrodes 132 include a plurality of third electrodes 132A and a plurality of fourth electrodes 132B. Each of the third electrodes 132A establishes electrical connection between two adjacent first magnetoresistive elements 20A that are disposed on two first electrodes 131A adjacent in the Y direction. Each of the fourth electrodes 132B establishes electrical connection between two adjacent second magnetoresistive elements 20B that are disposed on two second electrodes 13113 adjacent in the Y direction.

In each magnetic detection element train 120 of the second or third resistor section 22 or 23, the connection relationships between the first and second magnetic detection elements 20A and 20B and the upper and lower electrodes 132 and 131 are basically the same as those described above with reference to FIG. 10.

The wiring layer 130 further includes a plurality of first connection electrodes and a plurality of second connection electrodes. The first connection electrodes electrically connect the first and second electrodes 131A and 131B so that the first and second portions of each magnetic detection element train 120 are connected in series. The second connection electrodes electrically connect the first and second electrodes 131A and 131B so that the plurality of magnetic detection element trains 120 are connected in series in each of the first to fourth resistor sections 21 to 24. With such a configuration, each of the first to fourth resistor sections 21 to 24 includes a plurality of first magnetoresistive elements 20A and a plurality of second magnetoresistive elements 20B connected in series.

In the present embodiment, the first and second magnetoresistive elements 20A and 20B connected in series in each of the first to fourth resistor sections 21 to 24 receive respective portions of the output magnetic field component in the same direction.

Here, let n represent the number of the first magnetoresistive elements 20A included in each of the first to fourth resistor sections 21 to 24. The number of the second magnetoresistive elements 20B included in each of the first to fourth resistor sections 21 to 24 is also n. In this case, the resistance value of each of the first to fourth resistor sections 21 to 24 is represented as n(Ra+Rb), where Ra represents the first resistance value of the first magnetoresistive element 20A, and Rb represents the second resistance value of the second magnetoresistive element 20B.

The other configuration, function and effects of the present embodiment are the same as those of the first embodiment.

Third Embodiment

Figure 11:
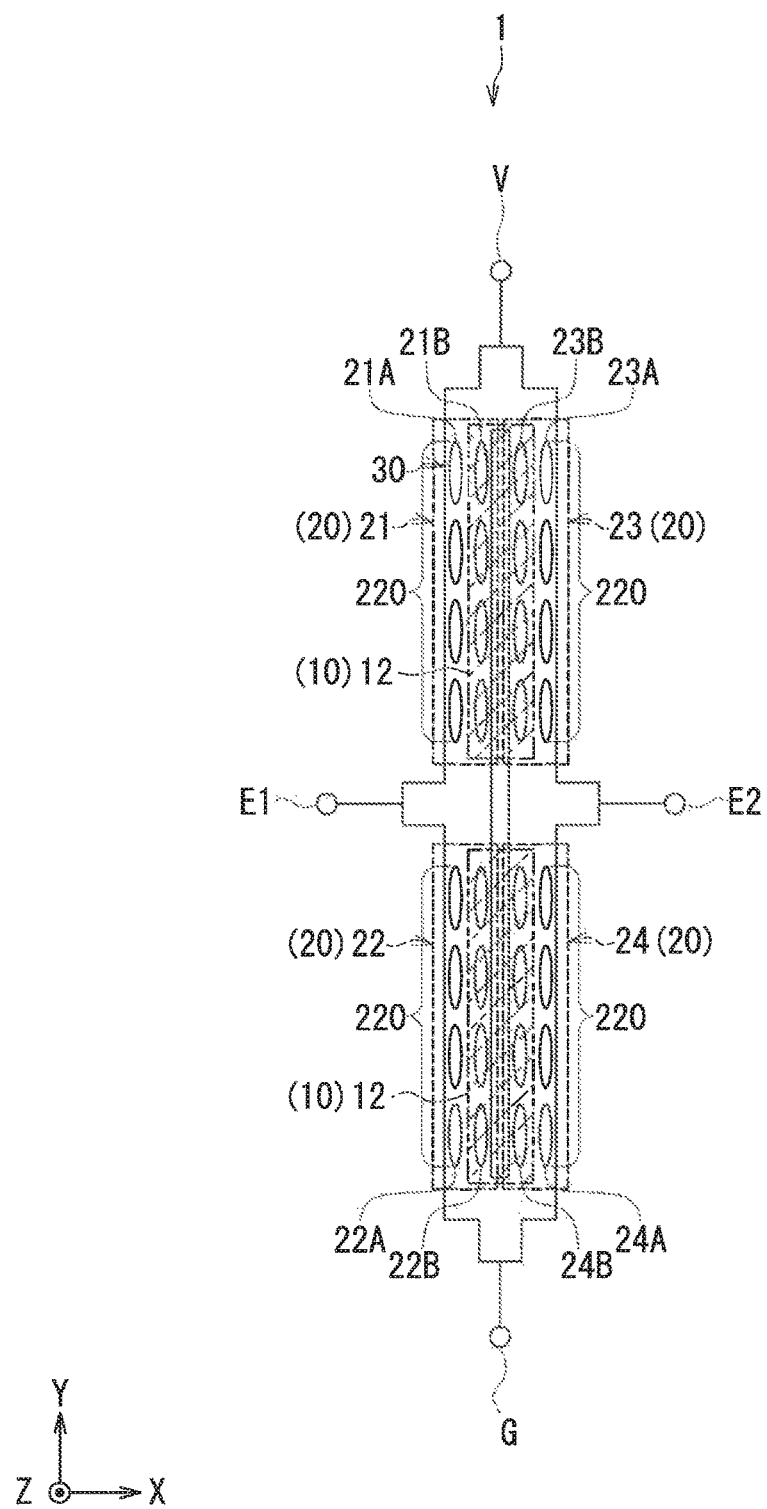
FIG. 11 is an explanatory diagram schematically illustrating the configuration of a magnetic sensor according to a third embodiment of the invention.
Figure 12:
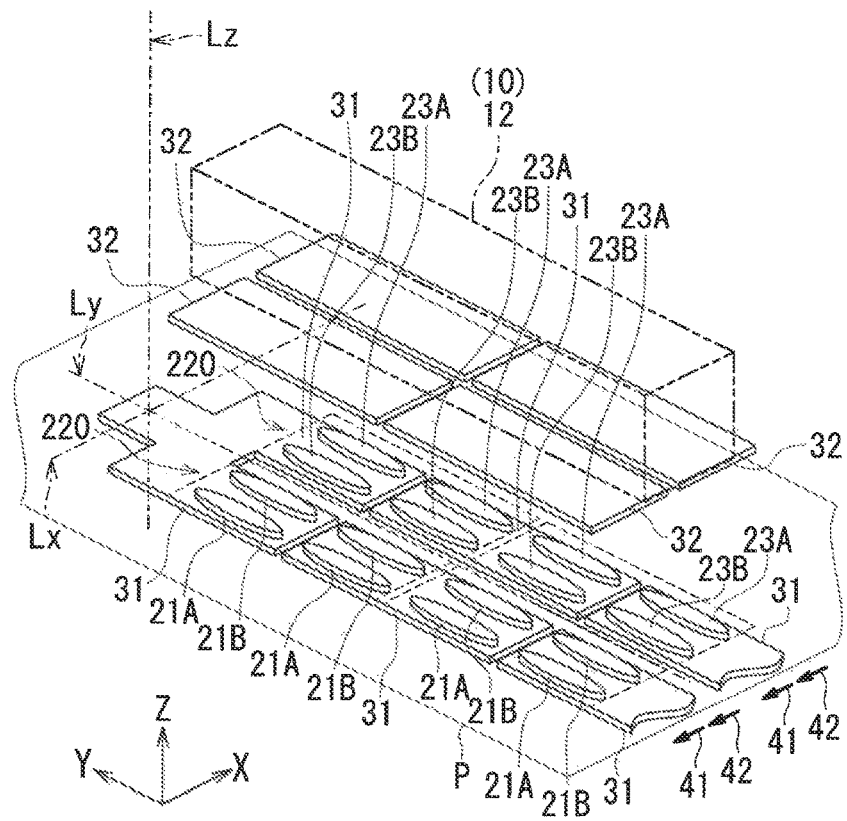
FIG. 12 is a partial, exploded perspective view of the magnetic sensor according to the third embodiment of the invention.

A third embodiment of the present invention will now be described. First, reference is made to FIG. 11 and FIG. 12 to describe the configuration of the magnetic sensor according to the third embodiment. FIG. 11 is an explanatory diagram schematically illustrating the configuration of the magnetic sensor according to the third embodiment. FIG. 12 is a partial, exploded perspective view of the magnetic sensor according to the third embodiment. The magnetic sensor 1 according to the third embodiment differs from the first embodiment in the following ways. In the third embodiment, each of the first to fourth resistor sections 21 to 24 of the magnetic field detection unit 20 includes a single magnetic detection element train 220 in place of the plurality of magnetic detection element trains 120 of the first embodiment.

The magnetic detection element train 220 includes a first portion in which a plurality of first magnetic detection elements 20A are aligned in the Y direction, and a second portion in which a plurality of second magnetic detection elements 20B are aligned in the Y direction. In each of the first and second resistor sections 21 and 22, the first portion and the second portion of the magnetic detection element train 220 are arranged in this order in the X direction. In each of the third and fourth resistor sections 23 and 24, the first portion and the second portion of the magnetic detection element train 220 are arranged in this order in the −X direction.

Further, in the present embodiment, the magnetic field conversion unit 10 includes two yokes 12 in place of the yokes 11 of the first embodiment. Each of the two yokes 12 is shaped like a rectangular solid that is elongated in a direction parallel to the third virtual straight line Ly. One of the two yokes 12 is disposed to overlap the second portions of the magnetic detection element trains 220 of the first and third resistor sections 21 and 23. The other of the two yokes 12 is disposed to overlap the second portions of the magnetic detection element trains 220 of the second and fourth resistor sections 22 and 24. The two yokes 12 are aligned in the Y direction.

In the present embodiment, the magnetization pinned layers 202 (see FIG. 5) of the first and second magnetoresistive elements 20A and 20B, i.e., the first and second magnetic detection elements 20A and 20B, included in the first and third resistor sections 21 and 23 of the magnetic field detection unit 20 are magnetized in the −X direction. The magnetization pinned layers 202 of the first and second magnetoresistive elements 20A and 20B, i.e., the first and second magnetic detection elements 20A and 20B, included in the second and fourth resistor sections 22 and 24 of the magnetic field detection unit 20 are magnetized in the X direction. In FIG. 12, the arrows 41 indicate the magnetization direction of the magnetization pinned layers 202 of the first magnetoresistive elements 20A included in the first and third resistor sections 21 and 23, and the arrows 42 indicate the magnetization direction of the magnetization pinned layers 202 of the second magnetoresistive elements 20B included in the first and third resistor sections 21 and 23.

In the present embodiment, the portions of the output magnetic field component that the first and second magnetoresistive elements 22A and 229 of the second resistor section 22 receive are in the same direction as the portions of the output magnetic field component that the first and second magnetoresistive elements 21A and 21B of the first resistor section 21 receive. On the other hand, the portions of the output magnetic field component that the first and second magnetoresistive elements 23A and 23B of the third resistor section 23 receive and the portions of the output magnetic field component that the first and second magnetoresistive elements 24A and 24B of the fourth resistor section 24 receive are in the opposite direction to the direction of the portions of the output magnetic field component that the first and second magnetoresistive elements 21A and 21B of the first resistor section 21 receive.

Figure 13:
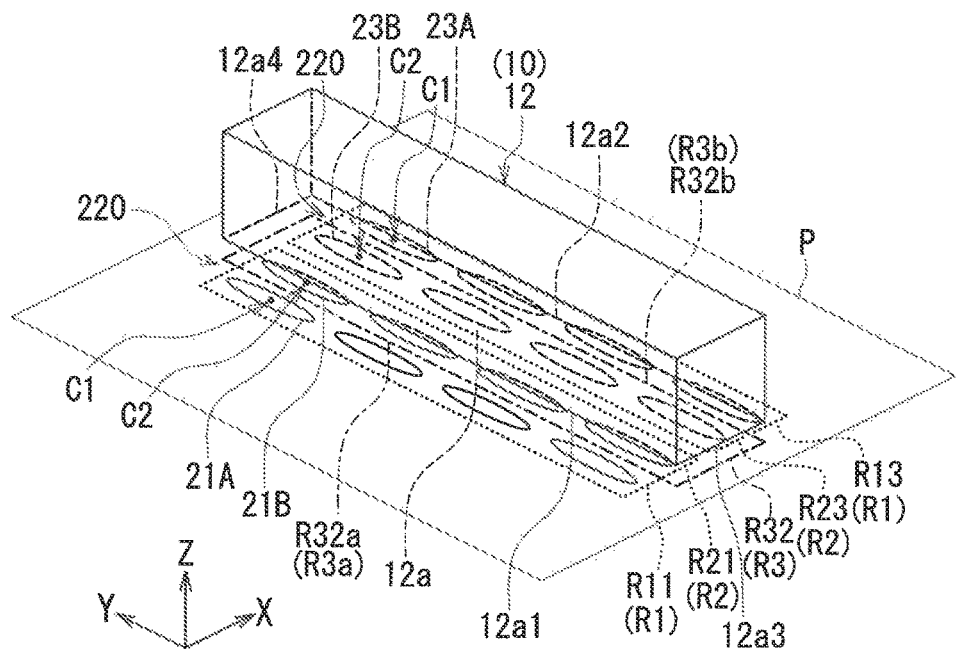
FIG. 13 is an explanatory diagram illustrating the positional relationship between a yoke and first and second magnetic detection elements in the third embodiment of the invention.

Reference is now made to FIG. 13 to describe the positional relationship between a yoke 12 and the first and second magnetic detection elements 20A and 20B. FIG. 13 is an explanatory diagram illustrating the positional relationship between a yoke 12 and the first and second magnetic detection elements 20A and 20B. Here, by way of example, the yoke 12 that overlaps the magnetic detection element trains 220 of the first and third resistor sections 21 and 23 will be described. FIG. 13 illustrates the magnetic detection element trains 220 of the first and third resistor sections 21 and 23 and the yoke 12.

As shown in FIG. 13, the yoke 12 has a yoke end face 12a located at an end in a direction parallel to the first virtual straight line Lz. In the present embodiment, the yoke end face 12a is located at the end of the yoke 12 in the −Z direction. As has been described in relation to the first embodiment, the end face projection region R3 is a region formed by vertically projecting the end face of the magnetic field conversion unit 10 onto the virtual plane P. The end face projection region R3 includes a yoke end face projection region R32 formed by vertically projecting the yoke end face R12a onto the virtual plane P. A portion of the first element-placement region R1 that defines the position of the first magnetic detection elements 21A of the first resistor section 21 will be referred to as the first element-placement region R11, and a portion of the first element-placement region R1 that defines the position of the first magnetic detection elements 23A of the third resistor section 23 will be referred to as the first element-placement region R13. A portion of the second element-placement region R2 that defines the position of the second magnetic detection elements 21B of the first resistor section 21 will be referred to as the second element-placement region R21, and a portion of the second element-placement region R2 that defines the position of the second magnetic detection elements 23B of the third resistor section 23 will be referred to as the second element-placement region R23. As shown in FIG. 13, the first element-placement regions R11 and R13 lie only outside the yoke end face projection region R32. The second element-placement regions R21 and R23 lie only inside the yoke end face projection region R32.

The yoke end face 12a has a first edge 12a1 and a second edge 12a2 located at opposite ends in a direction parallel to the second virtual straight line Lx, and has a third edge 12a3 and a fourth edge 12a4 located at opposite ends in a direction parallel to the third virtual straight line Ly. The first edge 12a1 is located at the end of the yoke end face 12a in the −X direction, the second edge 12a2 is located at the end of the yoke end face 12a in the X direction, the third edge 12a3 is located at the end of the yoke end face 12a in the −Y direction, and the fourth edge 12a4 is located at the end of the yoke end face 12a in the Y direction.

The yoke end face projection region R32 has a first edge R32a and a second edge R32b located at opposite ends in a direction parallel to the second virtual straight line Lx. The first edge R32a is located at the end of the yoke end face projection region R32 in the −X direction. The second edge R32b is located at the end of the yoke end face projection region R32 in the X direction. The first edge R32a is an edge formed by vertically projecting the first edge 12a1 of the yoke end face 12a onto the virtual plane P. The second edge R32b is an edge formed by vertically projecting the second edge 12a2 of the yoke end face 12a onto the virtual plane P.

The first edge R32a coincides with the edge R3a of the end face projection region R3. The end face projection region R3 further has an edge R3b orthogonal to the second virtual straight line Lx. The second edge R32b of the yoke end face projection region R32 coincides with the edge R3b of the end face projection region R3.

In the present embodiment, the first and second element-placement regions R11 and R21 are in contact with each other. The edge R3a of the end face projection region R3 and the first edge R32a of the yoke end face projection region R32 coincide with the border between the first and second element-placement regions R11 and R21. Further, in the present embodiment, the first and second element-placement regions R13 and R23 are in contact with each other. The edge R3b of the end face projection region R3 and the second edge R32b of the yoke end face projection region R32 coincide with the border between the first and second element-placement regions R13 and R23.

The first magnetic detection element 21A is disposed to intersect the first element-placement region R11 and not to intersect the second element-placement region R21. The second magnetic detection element 21B is disposed to intersect the second element-placement region R21 and not to intersect the first element-placement region R11.

The first magnetic detection element 23A is disposed to intersect the first element-placement region R13 and not to intersect the second element-placement region R23. The second magnetic detection element 23B is disposed to intersect the second element-placement region R23 and not to intersect the first element-placement region R13.

The positional relationship between the yoke 12 and the magnetic detection elements 22A, 22B, 24A and 24B is basically the same as the positional relationship described with reference to FIG. 13. Here, a portion of the first element-placement region R1 that defines the position of the first magnetic detection elements 22A of the second resistor section 22 will be referred to as the first element-placement region R12, and a portion of the first element-placement region R1 that defines the position of the first magnetic detection elements 24A of the fourth resistor section 24 will be referred to as the the first element-placement region R14. A portion of the second element-placement region R2 that defines the position of the second magnetic detection elements 23B of the third resistor section 23 will be referred to as the second element-placement region R23, and a portion of the second element-placement region R2 that defines the position of the second magnetic detection elements 24B of the fourth resistor section 24 will be referred to as the second element-placement region R24. To describe the positional relationship between the yoke 12 and the magnetic detection elements 22A, 22B, 24A, and 24B, the magnetic detection elements 22A, 22B, 24A, and 24B and the element-placement regions R12, R22, R14, and R24 are substituted for the magnetic detection elements 21A, 21B, 23A, and 2313 and the element-placement regions R11, R21, R13, and R23, respectively, in the above description of the positional relationship described with reference to FIG. 13.

The resistance values of the first to fourth resistor sections 21 to 24 of the present embodiment will now he described. Here, the first resistance value of the first magnetoresistive element 20A will be represented by the symbol Ra, and the second resistance value of the second magnetoresistive element 20B will be represented by the symbol Rb. As has been described in relation to the first embodiment, when no output magnetic field component is present, the magnetization direction of the free layer 204 (see FIG. 5) of each of the first and second magnetoresistive elements 20A and 20B is parallel to the third virtual straight line Ly. When the input magnetic field component is in the Z direction, the respective portions of the output magnetic field component that the first and second magnetoresistive elements 20A and 20B of the first and second resistor sections 21 and 22 receive are in the X direction, and the respective portions of the output magnetic field component that the first and second magnetoresistive elements 20A and 20B of the third and fourth resistor sections 23 and 24 receive are in the −X direction. In this case, in the first resistor section 21, the first and second resistance values Ra and Rb increase, and hence the resistance value of the first resistor section 21 also increases, when compared with the case where no output magnetic field component is present. In the second resistor section 22, the first and second resistance values Ra and Rb decrease, and hence the resistance value of the second resistor section 22 also decreases, when compared with the case where no output magnetic field component is present. In the third resistor section 23, the first and second resistance values Ra and Rb decrease, and hence the resistance value of the third resistor section 23 also decreases, when compared with the case where no output magnetic field component is present. In the fourth resistor section 24, the first and second resistance values Ra and Rb increase, and hence the resistance value of the fourth resistor section 24 also increases, when compared with the case where no output magnetic field component is present.

When the input magnetic field component is in the −Z direction, the directions of the portions of the output magnetic field component and the variations in the resistance values of the first to fourth resistor sections 21 to 24 are opposite to those in the foregoing case in which the input magnetic field component is in the Z direction.

The other configuration, function and effects of the present embodiment are the same as those of the first embodiment.

Fourth Embodiment

Figure 14:
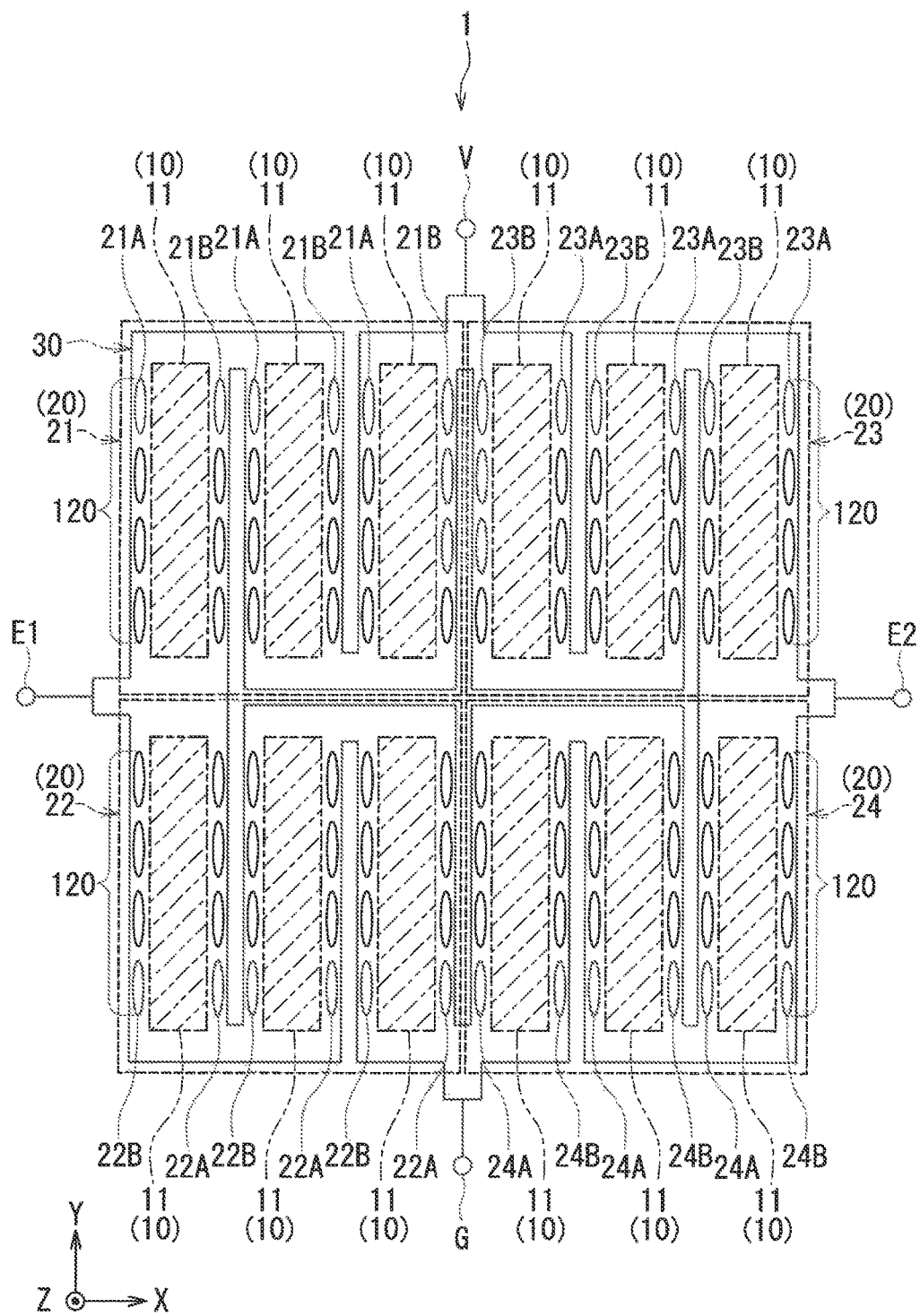
FIG. 14 is an explanatory diagram schematically illustrating the configuration of a magnetic sensor according to a fourth embodiment of the invention.
Figure 15:
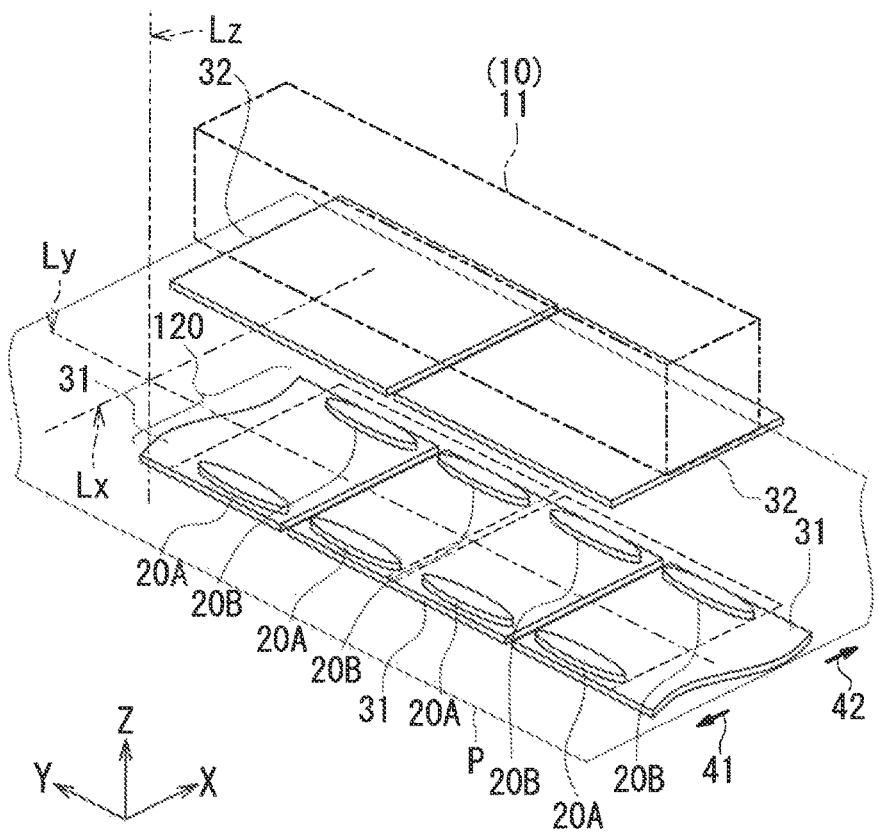
FIG. 15 is a partial, exploded perspective view of the magnetic sensor according to the fourth embodiment of the invention.

A fourth embodiment of the present invention will now be described. First, reference is made to FIG. 14 and FIG. 15 to describe the configuration of the magnetic sensor according to the fourth embodiment. FIG. 14 is an explanatory diagram schematically illustrating the configuration of the magnetic sensor according to the fourth embodiment. FIG. 15 is a partial, exploded perspective view of the magnetic sensor according to the fourth embodiment.

The magnetic sensor 1 according to the present embodiment differs from the first embodiment in the following ways. In the present embodiment, the magnetization pinned layer 202 (see FIG. 5) of the second magnetoresistive element 20B is magnetized in the X direction. The magnetization pinned layer 202 of the first magnetoresistive element 20A is magnetized in the −X direction, as with the first embodiment. In FIG. 15, the arrow 41 indicates the magnetization direction of the magnetization pinned layer 202 of the first magnetoresistive element 20A, and the arrow 42 indicates the magnetization direction of the magnetization pinned layer 202 of the second magnetoresistive element 20B.

Figure 16:
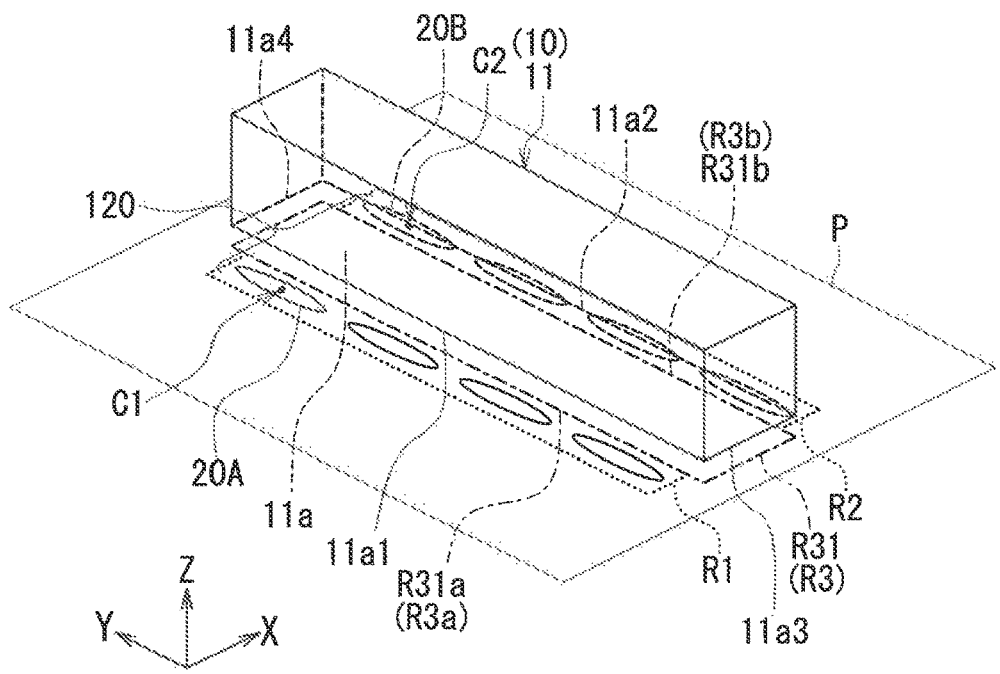
FIG. 16 is an explanatory diagram illustrating the positional relationship between a yoke and first and second magnetic detection elements in the fourth embodiment of the invention.

In the present embodiment, the positional relationship between the yokes 11 of the magnetic field conversion unit 10 and the first and second magnetic detection elements 20A and 20B is different from that in the first embodiment. The positional relationship between the yokes 11 and the first and second magnetic detection elements 20A and 20B will now be described with reference to FIG. 14 and FIG. 16. FIG. 16 is an explanatory diagram illustrating the positional relationship between a yoke 11 and the first and second magnetic detection elements 20A and 20B.

As shown in FIG. 14, the yokes 11 are disposed to overlap neither the first portions (the first magnetic detection elements 20A) nor the second portions (the second magnetic detection elements 20B) of the magnetic detection element trains 120 of the first to fourth resistor sections 21 to 24, when viewed in the Z direction. Here, by way of example, the positional relationship between a magnetic detection element train 120 of the first or fourth resistor section 21 or 24 and a yoke 11 will be described. FIG. 16 shows the yoke 11 and the magnetic detection element train 120 of the first or fourth resistor section 21 or 24.

As has been described in relation to the first embodiment, the first element-placement region R1 is a region defining the position of the first magnetic detection elements 20A, and the second element-placement region R2 is a region defining the position of the second magnetic detection elements 20B. The end face projection region R3 is a region formed by vertically projecting the end face of the magnetic field conversion unit 10 onto the virtual plane P. The yoke end face projection region R31 is a region formed by vertically projecting the yoke end face 11a onto the virtual plane P. In the present embodiment, as shown in FIG. 16, the first and second element-placement regions R1 and R2 lie only outside the end face projection region R3, and are located on opposite sides of the yoke end face projection region R31 in a direction parallel to the second virtual straight line Lx.

As has been described in relation to the first embodiment, the yoke end face projection region R31 has the first edge R31a. The yoke end face projection region R31 further has a second edge R31b orthogonal to the second virtual straight line Lx. The first edge R31a and the second edge R31b are located at opposite ends of the yoke end face projection region R31 in a direction parallel to the second virtual straight line Lx. The first edge R31a is located at the end of the yoke end face projection region R31 in the −X direction. The second edge R31b is located at the end of the yoke end face projection region R31 in the X direction. The second edge R31b is an edge formed by vertically projecting the second edge 11a2 of the yoke end face 11a onto the virtual plane P.

The first edge R31a coincides with the edge R3a of the end face projection region R3. The end face projection region R3 further has an edge R3b orthogonal to the second virtual straight line Lx and located between the first and second element-placement regions R1 and R2. The second edge R31b of the yoke end face projection region R31 coincides with the edge R3b of the end face projection region R3.

The first element-placement region R1 is in contact with the first edge R31a of the yoke end face projection region R31. The second element-placement region R2 is in contact with the second edge R31b of the yoke end face projection region R31.

The first magnetic detection element 20A is disposed to intersect the first element-placement region R1 and not to intersect the second element-placement region R2. The second magnetic detection element 20B is disposed to intersect the second element-placement region R2 and not to intersect the first element-placement region R1.

The positional relationship between a yoke 11 and the first and second magnetic detection elements 20A and 20B of the second or third resistor section 22 or 23 is basically the same as the positional relationship described with reference to FIG. 16. However, in the yokes 11 related to the second and third resistor sections 22 and 23, the first edge 11a1 is located at the end of the yoke end face 11a in the X direction, and the second edge 11a2 is located at the end of the yoke end face 11a in the −X direction. In the yoke end face projection region R31 formed by vertically projecting the yoke end face 11a of the yoke 11 onto the virtual plane P, the first edge R31a is located at the end of the yoke end face projection region R31 in the X direction, and the second edge R31b is located at the end of the yoke end face projection region R31 in the −X direction.

Directions of portions of the output magnetic field component in the present embodiment will now be described. In the present embodiment, the portions of the output magnetic field component that the first and second magnetic detection elements 20A and 20B constituting an element pair receive are in mutually opposite directions. The portion of the output magnetic field component that the first magnetic detection element 24A receives is in the same direction as the portion of the output magnetic field component that the first magnetic detection element 21A receives. The portion of the output magnetic field component that the second magnetic detection element 24B receives is in the same direction as the portion of the output magnetic field component that the second magnetic detection element 21B receives. On the other hand, the portions of the output magnetic field component that the first magnetic detection elements 22A and 23A receive are in the opposite direction to the direction of the portion of the output magnetic field component that the first magnetic detection element 21A receives, and the portions of the output magnetic field component that the second magnetic detection elements 22B and 23B receive are in the opposite direction to the direction of the portion of the output magnetic field component that the second magnetic detection element 21B receives.

The resistance values of the first to fourth resistor sections 21 to 24 of the present embodiment will now be described. Here, the first resistance value of the first magnetoresistive element 20A will be represented by the symbol Ra, and the second resistance value of the second magnetoresistive element 20B will be represented by the symbol Rb. As has been described in relation to the first embodiment, when no output magnetic field component is present, the magnetization direction of the free layer 204 (see FIG. 5) of each of the first and second magnetoresistive elements 20A and 20B is parallel to the third virtual straight line Ly. When the input magnetic field component is in the Z direction, the respective portions of the output magnetic field component that the first magnetoresistive elements 20A in the first and fourth resistor sections 21 and 24 and the second magnetoresistive elements 20B in the second and third resistor sections 22 and 23 receive are in the X direction, and the respective portions of the output magnetic field component that the second magnetoresistive elements 20B in the first and fourth resistor sections 21 and 24 and the first magnetoresistive elements 20A in the second and third resistor sections 22 and 23 receive are in the −X direction. In this case, in the first and fourth resistor sections 21 and 24, the first and second resistance values Ra and Rb increase, and hence the resistance values of the first and fourth resistor sections 21 and 24 also increase, when compared with the case where no output magnetic field component is present. In the second and third resistor sections 22 and 23, the first and second resistance values Ra and Rb decrease, and hence the resistance values of the second and third resistor sections 22 and 23 also decrease, when compared with the case where no output magnetic field component is present.

When the input magnetic field component is in the −Z direction, the directions of the portions of the output magnetic field component and the variations in the resistance values of the first to fourth resistor sections 21 to 24 are opposite to those in the foregoing case in which the input magnetic field component is in the Z direction.

The magnetic sensor 1 according to the present embodiment may include the wiring layer 130 described in relation to the second embodiment, in place of the wiring layer 30. The other configuration, function and effects of the present embodiment are the same as those of the first or second embodiment.

Fifth Embodiment

Figure 17:
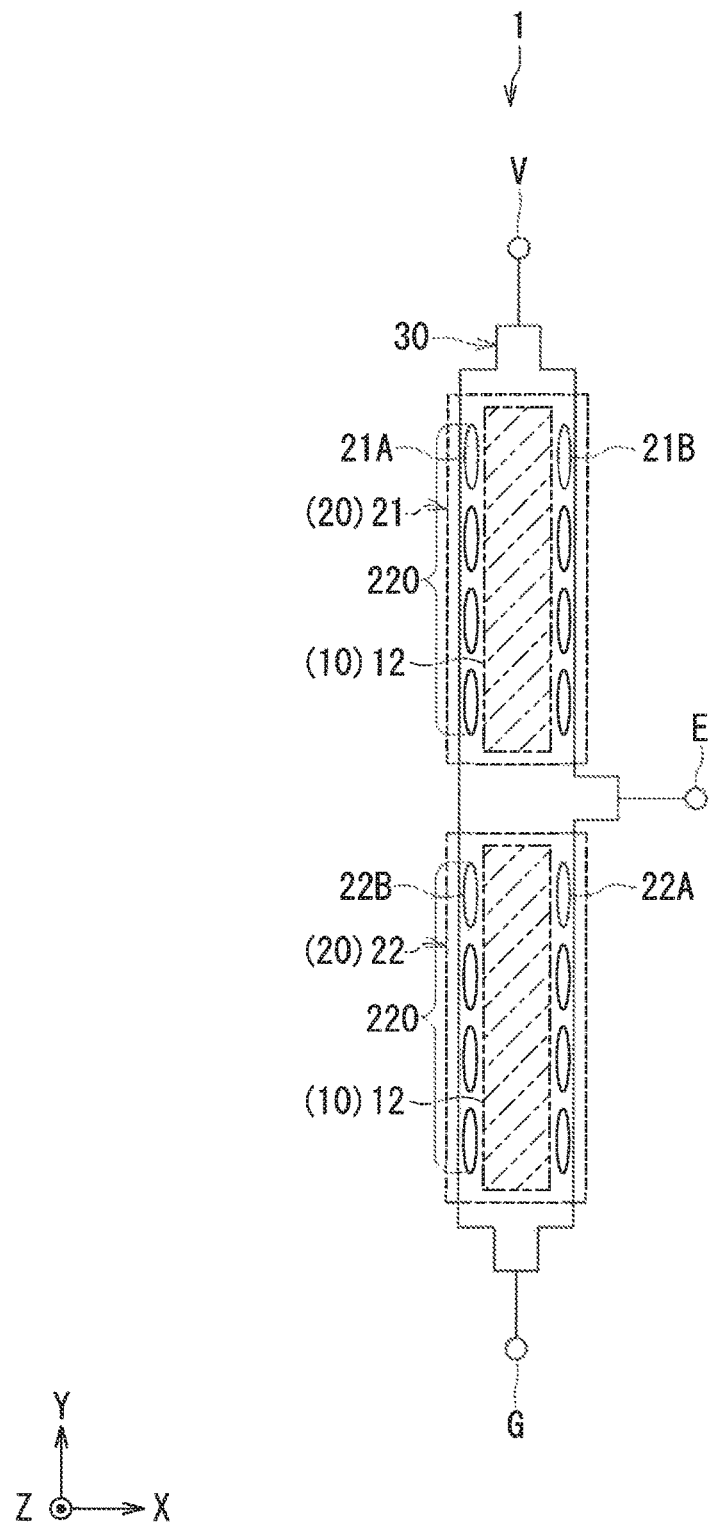
FIG. 17 is an explanatory diagram schematically illustrating the configuration of a magnetic sensor according to a fifth embodiment of the invention.

A fifth embodiment of the present invention will now he described with reference to FIG. 17. FIG. 17 is an explanatory diagram schematically illustrating the configuration of the magnetic sensor according to the fifth embodiment. The magnetic sensor 1 according to the fifth embodiment differs from the fourth embodiment in the following ways. The magnetic sensor 1 according to the fifth embodiment is configured without the third and fourth resistor sections 23 and 24 of the fourth embodiment. Further, the magnetic field detection unit 20 includes a single output port E in place of the first and second output ports E1 and E2 of the fourth embodiment.

In the present embodiment, the first resistor section 21 and the second resistor section 22 are connected in series and configured to be energized. To be more specific, the first resistor section 21 and the second resistor section 22 are arranged in this order between the power supply port V and the ground port G. The connection point between the first resistor section 21 and the second resistor section 22 is electrically connected to the output port E.

The resistance value of the first resistor section 21 and the resistance value of the second resistor section 22 vary depending on the input magnetic field component in the same manner as in the fourth embodiment. Specifically, when the input magnetic field component varies, one of the resistance value of the first resistor section 21 and the resistance value of the second resistor section 22 increases while the other decreases. This varies the potential at the connection point between the first resistor section 21 and the second resistor section 22. The magnetic field detection unit 20 generates a signal that depends on the potential at the output port E, which is the connection point between the first resistor section 21 and the second resistor section 22, as an output signal.

In the present embodiment, each of the first and second resistor sections 21 and 22 of the magnetic field detection unit 20 includes a single magnetic detection element train 220, which has been described in relation to the third embodiment, in place of the plurality of magnetic detection element trains 120 of the fourth embodiment. The magnetic detection element train 220 includes a first portion in which a plurality of first magnetic detection elements 20A are aligned in the Y direction, and a second portion in which a plurality of second magnetic detection elements 20B are aligned in the Y direction. In the first resistor section 21, the first portion and the second portion of the magnetic detection element train 220 are arranged in this order in the X direction. In the second resistor section 22, the first portion and the second portion of the magnetic detection element train 220 are arranged in this order in the −X direction.

In the present embodiment, the magnetic field conversion unit 10 includes two yokes 12 described in relation to the third embodiment, in place of the plurality of yokes 11 of the fourth embodiment. As shown in FIG. 17, the two yokes 12 are disposed to overlap neither of the first and second portions of the magnetic detection element trains 220 of the first and second resistor sections 21 and 22 when viewed in the Z direction. The positional relationship between the yokes 12 and the magnetic detection elements 21A, 21B, 22A and 22B is the same as the positional relationship between the yokes 11 and the magnetic detection elements 21A, 21B, 22A and 22B of the fourth embodiment.

The other configuration, function and effects of the present embodiment are the same as those of the fourth embodiment.

Sixth Embodiment

Figure 18:
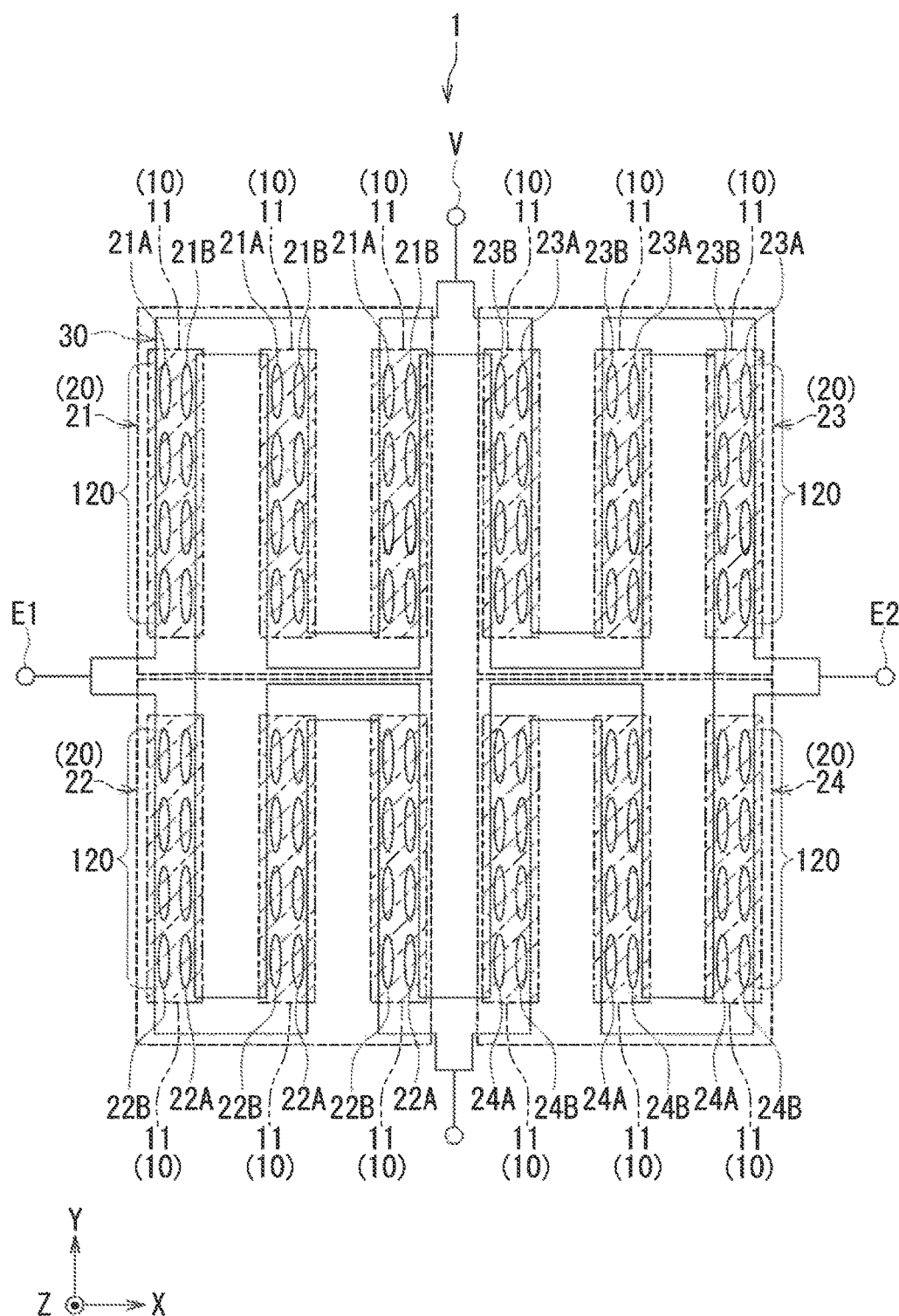
FIG. 18 is an explanatory diagram schematically illustrating the configuration of a magnetic sensor according to a sixth embodiment of the invention.
Figure 19:
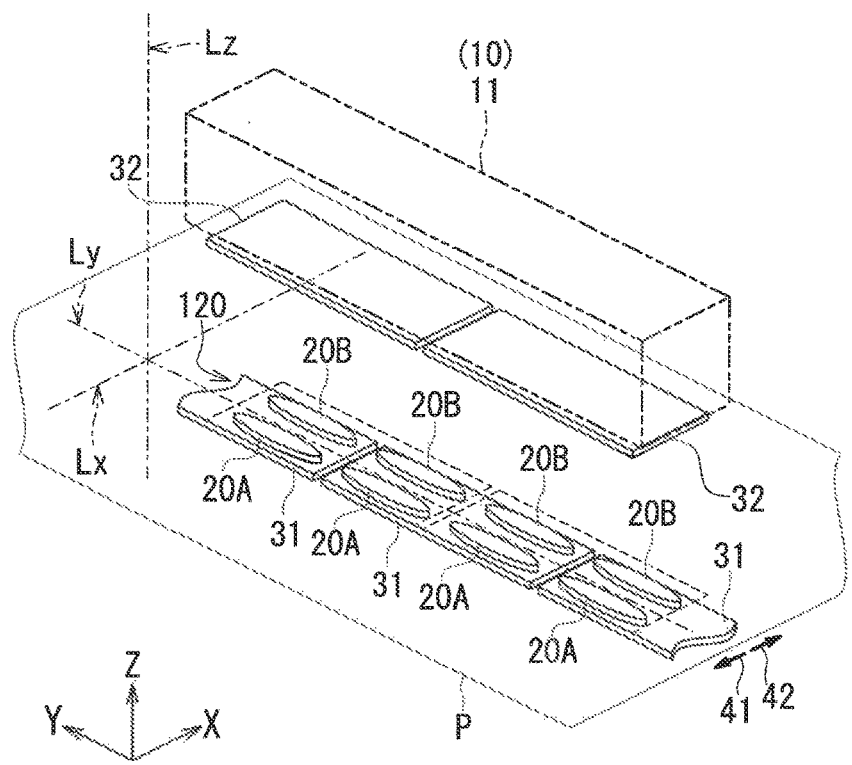
FIG. 19 is a partial, exploded perspective view of the magnetic sensor according to the sixth embodiment of the invention.
Figure 20:
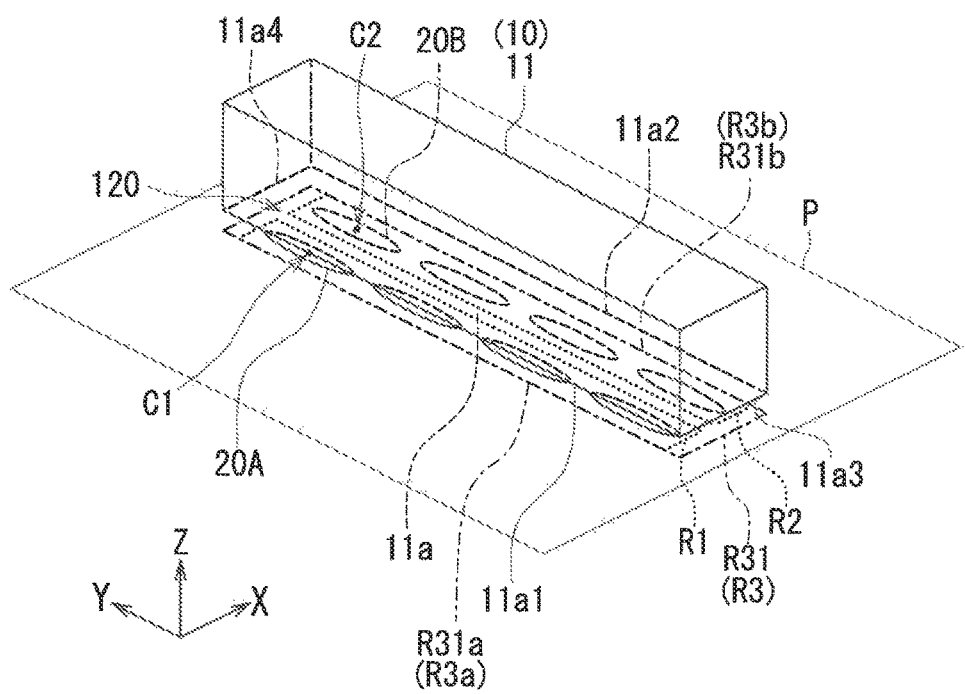
FIG. 20 is an explanatory diagram illustrating the positional relationship between a yoke and first and second magnetic detection elements in the sixth embodiment of the invention.

A sixth embodiment of the present invention will now be described. First, reference is made to FIG. 18 to FIG. 20 to describe the configuration of the magnetic sensor according to the sixth embodiment. FIG. 18 is an explanatory diagram schematically illustrating the configuration of the magnetic sensor according to the sixth embodiment. FIG. 19 is a partial, exploded perspective view of the magnetic sensor according to the sixth embodiment. FIG. 20 is an explanatory diagram illustrating the positional relationship between a yoke 11 and the first and second magnetic detection elements 20A and 20B.

The magnetic sensor 1 according to the present embodiment differs from the fourth embodiment in the following ways. In the present embodiment, as shown in FIG. 18, the yokes 11 are disposed to overlap the first portions (the first magnetic detection elements 20A) and the second portions (the second magnetic detection elements 20B) of the magnetic detection element trains 120 of the first to fourth resistor sections 21 to 24 when viewed in the Z direction. Here, by way of example, the positional relationship between the magnetic detection element train 120 of the first or fourth resistor section 21 or 24 and a yoke 11 will be described. FIG. 20 illustrates the magnetic detection element train 120 of the first or fourth resistor section 21 or 24 and the yoke 11.

As has been described in relation to the fourth embodiment (the first embodiment), the first element-placement region R1 is a region defining the position of the first magnetic detection elements 20A, and the second element-placement region R2 is a region defining the position of the second magnetic detection elements 20B. The end face projection region R3 is a region formed by vertically projecting the end face of the magnetic field conversion unit 10 onto the virtual plane P. The yoke end face projection region R31 is a region formed by vertically projecting the yoke end face 11a onto the virtual plane P. The yoke end face projection region R31 has a first edge R31a and a second edge R31b.

In the present embodiment, as shown in FIG. 20, the first element-placement region R1 and the second element-placement region R2 lie only inside the yoke end face projection region R31. The first element-placement region R1 is located between the first edge R31a and the second element-placement region R2. The second element-placement region R2 is located between the second edge R31b and the first element-placement region R1. In the present embodiment, in particular, the first element-placement region R1 is in contact with the first edge R31a. The second element-placement region R2 is in contact with the second edge R31b. In the present embodiment, the first element-placement region R1 and the second element-placement region R2 are not in contact with each other.

The first magnetic detection element 20A is disposed to intersect the first element-placement region R1 and not to intersect the second element-placement region R2. The second magnetic detection element 20B is disposed to intersect the second element-placement region R2 and not to intersect the first element-placement region R1.

The positional relationship between a yoke 11 and the first and second magnetic detection elements 20A and 20B of the second or third resistor section 22 or 23 is basically the same as the positional relationship described with reference to FIG. 20. However, in the yokes 11 related to the second and third resistor sections 22 and 23, the first edge 11a1 is located at the end of the yoke end face 11a in the X direction, and the second edge 11a2 is located at the end of the yoke end face 11a in the −X direction. In the yoke end face projection region R31 formed by vertically projecting the yoke end face 11a of the yoke 11 onto the virtual plane P, the first edge R31a is located at the end of the yoke end face projection region R31 in the X direction, and the second edge R31b is located at the end of the yoke end face projection region R31 in the −X direction.

The magnetic sensor 1 according to the present embodiment may include the wiring layer 130 described in relation to the second embodiment, in place of the wiring layer 30. The other configuration, function and effects of the present embodiment are the same as those of the second or fourth embodiment.

Seventh Embodiment

Figure 21:
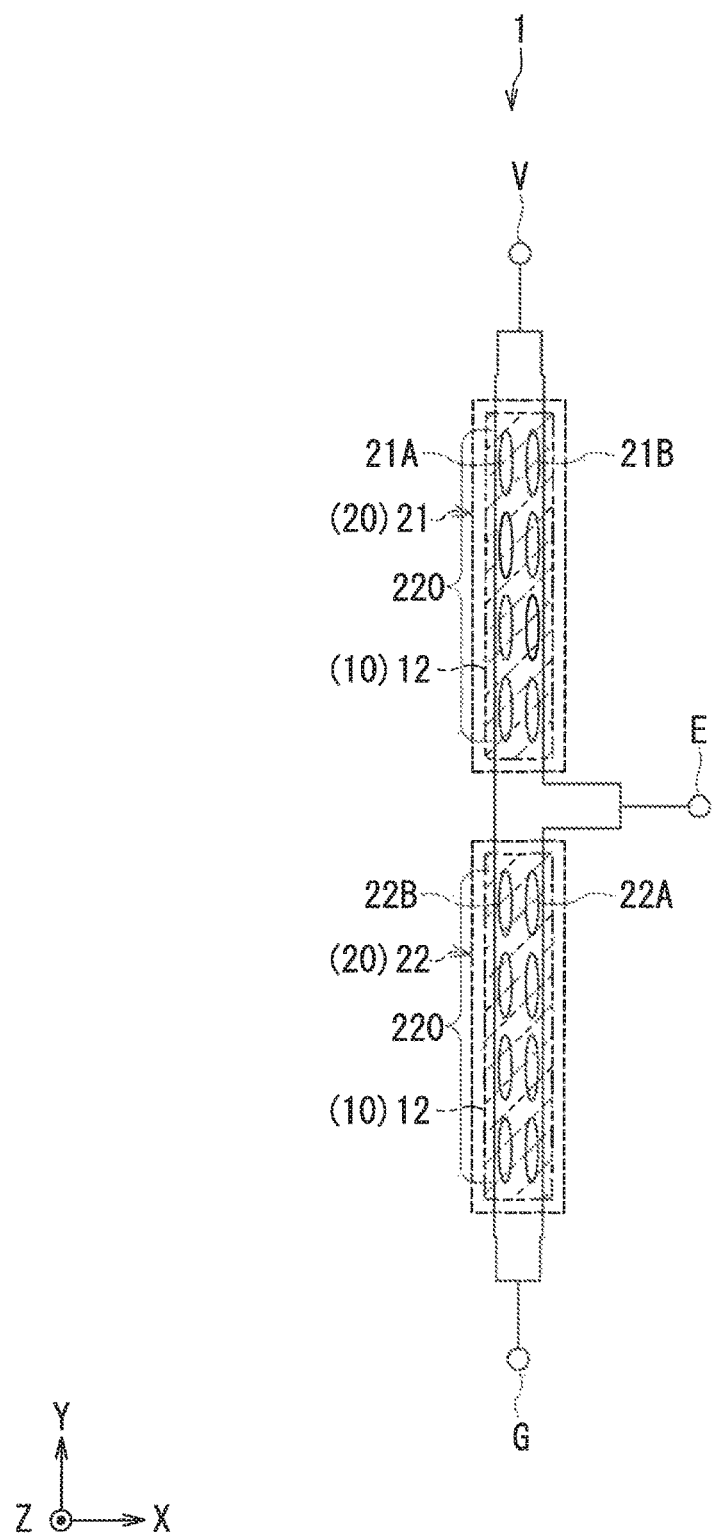
FIG. 21 is an explanatory diagram schematically illustrating the configuration of a magnetic sensor according to a seventh embodiment of the invention.

A seventh embodiment of the present invention will now be described with reference to FIG. 21. FIG. 21 is an explanatory diagram schematically illustrating the configuration of the magnetic sensor according to the seventh embodiment. The magnetic sensor 1 according to the seventh embodiment differs from the fifth embodiment in the following ways. In the magnetic sensor 1 according to the seventh embodiment, the positional relationship between a yoke 11 and the first and second magnetic detection elements 21A and 21B of the first resistor section 21 is the same as the positional relationship between a yoke 11 and the first and second magnetic detection elements 20A and 20B of the first or fourth resistor section 21 or 24 in the sixth embodiment. The positional relationship between a yoke 11 and the first and second magnetic detection elements 22A and 22B of the second resistor section 22 is the same as the positional relationship between a yoke 11 and the first and second magnetic detection elements 20A and 20B of the second or third resistor section 22 or 23 in the sixth embodiment.

The other configuration, function and effects of the present embodiment are the same as those of the fifth or sixth embodiment.

Eighth Embodiment

Figure 22:
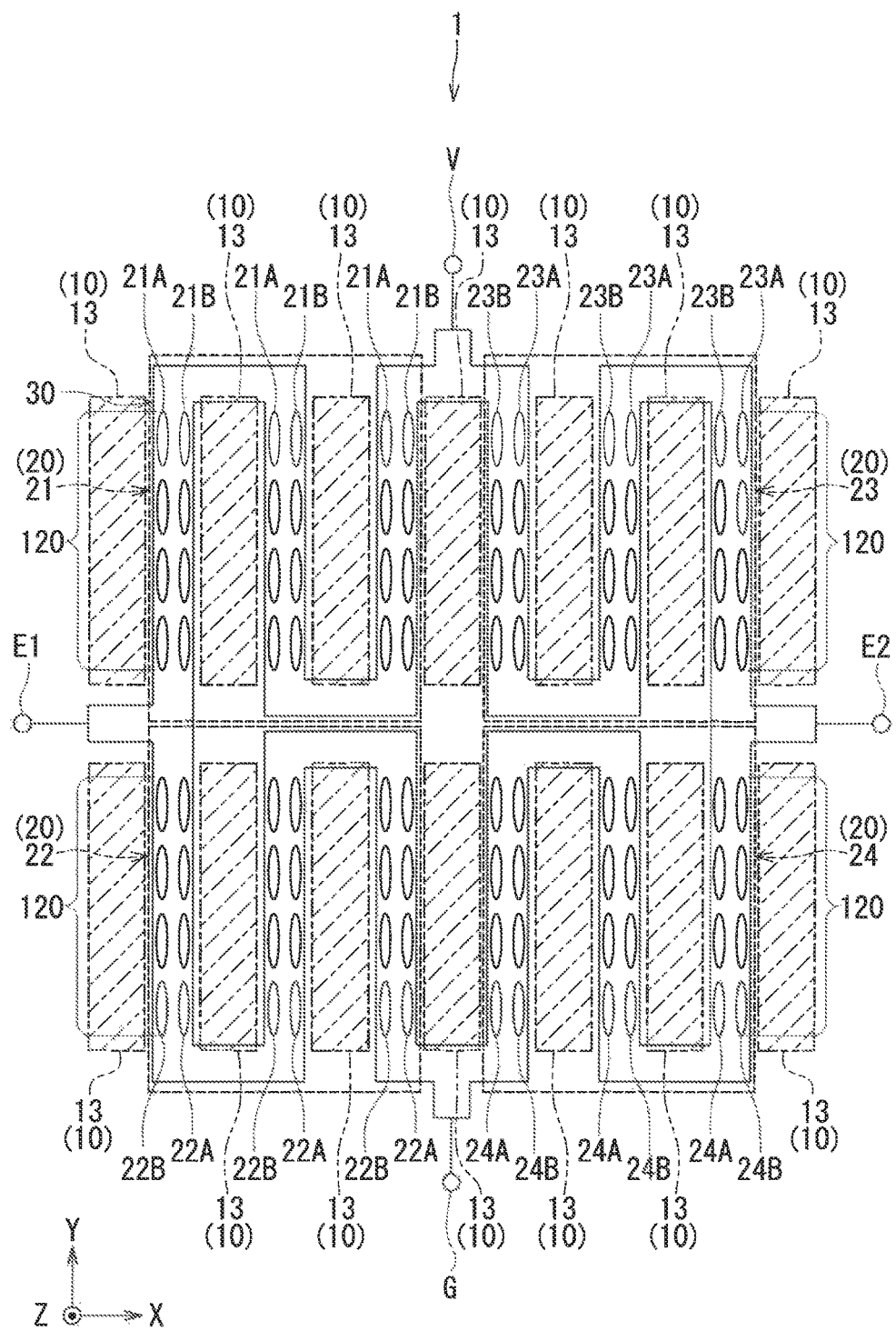
FIG. 22 is an explanatory diagram schematically illustrating the configuration of a magnetic sensor according to an eighth embodiment of the invention.
Figure 23:
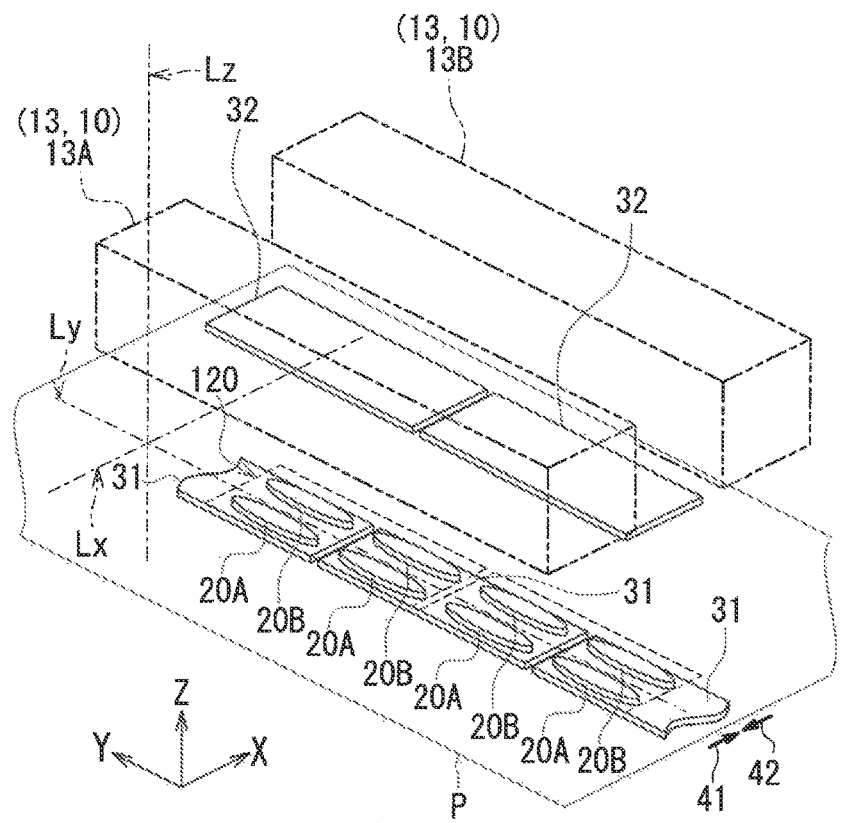
FIG. 23 is a partial, exploded perspective view of the magnetic sensor according to the eighth embodiment of the invention.
Figure 24:
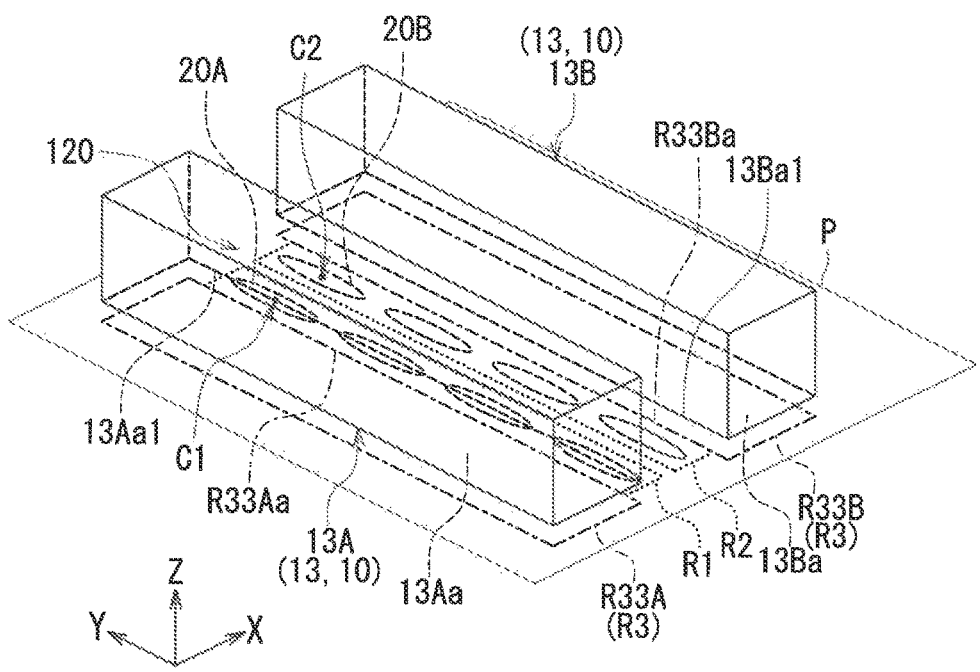
FIG. 24 is an explanatory diagram illustrating the positional relationship between yokes and first and second magnetic detection elements in the eighth embodiment of the invention.

A eighth embodiment of the present invention will now he described. First, reference is made to FIG. 22 to FIG. 24 to describe the configuration of the magnetic sensor according to the eighth embodiment. FIG. 22 is an explanatory diagram schematically illustrating the configuration of the magnetic sensor according to the eighth embodiment. FIG. 23 is a partial, exploded perspective view of the magnetic sensor according to the eighth embodiment. FIG. 24 is an explanatory diagram illustrating the positional relationship between yokes and the first and second magnetic detection elements 20A and 20B.

The magnetic sensor 1 according to the present embodiment differs from the fourth embodiment in the following ways. In the present embodiment, the magnetization pinned layer 202 (see FIG. 5) of the first magnetoresistive element 20A is magnetized in the X direction, and the magnetization pinned layer 202 of the second magnetoresistive element 20B is magnetized in the −X direction. In FIG. 23, the arrow 41 indicates the magnetization direction of the magnetization pinned layer 202 of the first magnetoresistive element 20A, and the arrow 42 indicates the magnetization direction of the magnetization pinned layer 202 of the second magnetoresistive element 20B.

In the present embodiment, the magnetic field conversion unit 10 includes a plurality of yokes 13 in place of the plurality of yokes 11 of the fourth embodiment. Each of the yokes 13 is shaped like a rectangular solid that is elongated in a direction parallel to the third virtual straight line Ly.

As shown in FIG. 22, the yokes 13 are disposed not to overlap the magnetic detection element trains 120 of the first to fourth resistor sections 21 to 24 when viewed in the Z direction. A single magnetic detection element train 120 is located between two yokes 13 adjacent in the X direction. Here, by way of example, the positional relationship between a single magnetic detection element train 120 of the first or fourth resistor section 21 or 24 and two yokes 13 will be described. FIG. 24 illustrates a single magnetic detection element train 120 of the first or fourth resistor section 21 or 24 and two yokes 13.

In the present embodiment, two yokes 13 located on opposite sides of a single magnetic detection element train 120 in the X direction correspond to the first yoke and the second yoke of the present invention. In FIGS. 23 and 24, the yoke 13 located forward of the magnetic detection element train 120 in the −X direction is denoted by the reference sign 13A, and the yoke 13 located forward of the magnetic detection element train 120 in the X direction is denoted by the reference sign 13B. The yokes 13A and 13B correspond to the first yoke and the second yoke of the present invention, respectively.

The yoke 13A has a first yoke end face 13Aa located at an end in a direction parallel to the first virtual straight line Lz. In the present embodiment, the first yoke end face 13Aa is located at the end of the yoke 13A in the −Z direction. The yoke 13B has a second yoke end face 13Ba located at an end in a direction parallel to the first virtual straight line Lz. In the present embodiment, the second yoke end face 13Ba is located at the end of the yoke 13B in the −Z direction.

As has been described in relation to the fourth embodiment (the first embodiment), the first element-placement region R1 is a region defining the position of the first magnetic detection elements 20A, and the second element-placement region R2 is a region defining the position of the second magnetic detection elements 20B. The end face projection region R3 is a region formed by vertically projecting the end face of the magnetic field conversion unit 10 onto the virtual plane P. In the present embodiment, the end face projection region R3 includes a first yoke end face projection region R33A and a second yoke end face projection region R33B, in place of the yoke end face projection region R31 of the fourth embodiment. The first yoke end face projection region R33A is formed by vertically projecting the first yoke end face 13Aa onto the virtual plane P. The second yoke end face projection region R33B is formed by vertically projecting the second yoke end face 13Ba onto the virtual plane P. In the present embodiment, the end face projection region R3 does not have the edge R3a of the first embodiment.

As shown in FIG. 24, the first element-placement region R1 is closer to the first yoke end face 13Aa than to the second yoke end face 13Ba. The second element-placement region R2 is closer to the second yoke end face 13Ba than to the first yoke end face 13Aa. In the present embodiment, in particular, the first element-placement region R1 and the second element-placement region R2 lie only outside the end face projection region R3, and are located between the first yoke end face projection region R33A and the second yoke end face projection region R33B.

The first yoke end face 13Aa has a first edge 13Aa1 closest to the first element-placement region R1. The first yoke end face projection region R33A has a first edge R33Aa orthogonal to the second virtual straight line Lx. The first edge R33Aa is an edge formed by vertically projecting the first edge 13Aa1 of the first yoke end face 13Aa onto the virtual plane P. The second yoke end face 13Ba has a second edge 13Ba1 closest to the second element-placement region R2. The second yoke end face projection region R33B has a second edge R33Ba orthogonal to the second virtual straight line Lx. The second edge R33Ba is an edge formed by vertically projecting the second edge 13Ba1 of the second yoke end face 13Ba onto the virtual plane P.

In the present embodiment, the first element-placement region R1 is in contact with the first edge R33Aa of the first yoke end face projection region R33A. The second element-placement region R2 is in contact with the second edge R33Ba of the second yoke end face projection region R33B. In the present embodiment, the first element-placement region R1 and the second element-placement region R2 are not n contact with each other.

The first magnetic detection element 20A is disposed to intersect the first element-placement region R1 and not to intersect the second element-placement region R2. The second magnetic detection element 20B is disposed to intersect the second element-placement region R2 and not to intersect the first element-placement region R1.

The positional relationship between the first and second magnetic detection elements 20A and 20B of the second or third resistor section 22 or 23 and the yokes 13A and 13B is basically the same as the positional relationship described with reference to FIG. 24. For the second and third resistor sections 22 and 23, however, the yoke 13A is located forward of the magnetic detection element train 120 in the X direction, and the yoke 13B is located forward of the magnetic detection element train 120 in the −X direction.

FIG. 24 shows the first center of gravity C1, which is the center of gravity of a portion of the first element-placement region R1 that intersects the first magnetic detection element 20A, and the second center of gravity C2, which is the center of gravity of a portion of the second element-placement region R2 that intersects the second magnetic detection element 20B. In the present embodiment, a first distance and a second distance are defined as follows. The first distance is the distance between a first point in the first element-placement region R1 and the first edge 13Aa1 of the first yoke end face 13Aa. The second distance is the distance between a second point in the second element-placement region R2 and the second edge 13Ba1 of the second yoke end face 13Ba. Here, assume that the first center of gravity C1 is the aforementioned first point, and the second center of gravity C2 is the aforementioned second point.

When a misalignment occurs between the magnetic field conversion unit 10 and the magnetic field detection unit 20, the first distance and the second distance vary. When the first point and the second point are moved in one direction parallel to the second virtual straight line Lx, one of the first and second distances decreases while the other increases. For example, in the first and fourth resistor sections 21 and 24, moving the first and second points in the X direction increases the first distance and decreases the second distance. On the other hand, moving the first and second points in the −X direction decreases the first distance and increases the second distance. The relationship between an increase or decrease in the first distance and an increase or decrease in the conversion efficiency and the strength of the output magnetic field component at the first point, and the relationship between an increase or decrease in the second distance and an increase or decrease in the conversion efficiency and the strength of the output magnetic field component at the second point are the same as those in the first embodiment.

In the second and third resistor sections 22 and 23, moving the first and second points in the X direction decreases the first distance and increases the second distance. On the other hand, moving the first and second points in the −X direction increases the first distance and decreases the second distance.

The resistance values of the first to fourth resistor sections 21 to 24 of the present embodiment will now be described. Here, the first resistance value of the first magnetoresistive element 20A will be represented by the symbol Ra, and the second resistance value of the second magnetoresistive element 20B will be represented by the symbol Rb. As has been described in relation to the fourth embodiment (the first embodiment), when no output magnetic field component is present, the magnetization direction of the free layer 204 (see FIG. 5) of each of the first and second magnetoresistive elements 20A and 20B is parallel to the third virtual straight line Ly. When the input magnetic field component is in the Z direction, the respective portions of the output magnetic field component that the first magnetoresistive elements 20A in the first and fourth resistor sections 21 and 24 and the second magnetoresistive elements 20B in the second and third resistor sections 22 and 23 receive are in the −X direction, and the respective portions of the output magnetic field component that the second magnetoresistive elements 20B in the first and fourth resistor sections 21 and 24 and the first magnetoresistive elements in the second and third resistor sections 22 and 23 receive are in the X direction. In this case, in the first and fourth resistor sections 21 and 24, the first and second resistance values Ra and Rb increase, and hence the resistance values of the first and fourth resistor sections 21 and 24 also increase, when compared with the case where no output magnetic field component is present. In the second and third resistor sections 22 and 23, the first and second resistance values Ra and Rb decrease, and hence the resistance values of the second and third resistor sections 22 and 23 also decrease, when compared with the case where no output magnetic field component is present.

When the input magnetic field component is in the −Z direction, the directions of the portions of the output magnetic field component and the variations in the resistance values of the first to fourth resistor sections 21 to 24 are opposite to those in the foregoing case in which the input magnetic field component is in the Z direction.

The magnetic sensor 1 according to the present embodiment may include the wiring layer 130 described in relation to the second embodiment, in place of the wiring layer 30. The other configuration, function and effects of the present embodiment are the same as those of the first or fourth embodiment.

Ninth Embodiment

Figure 25:
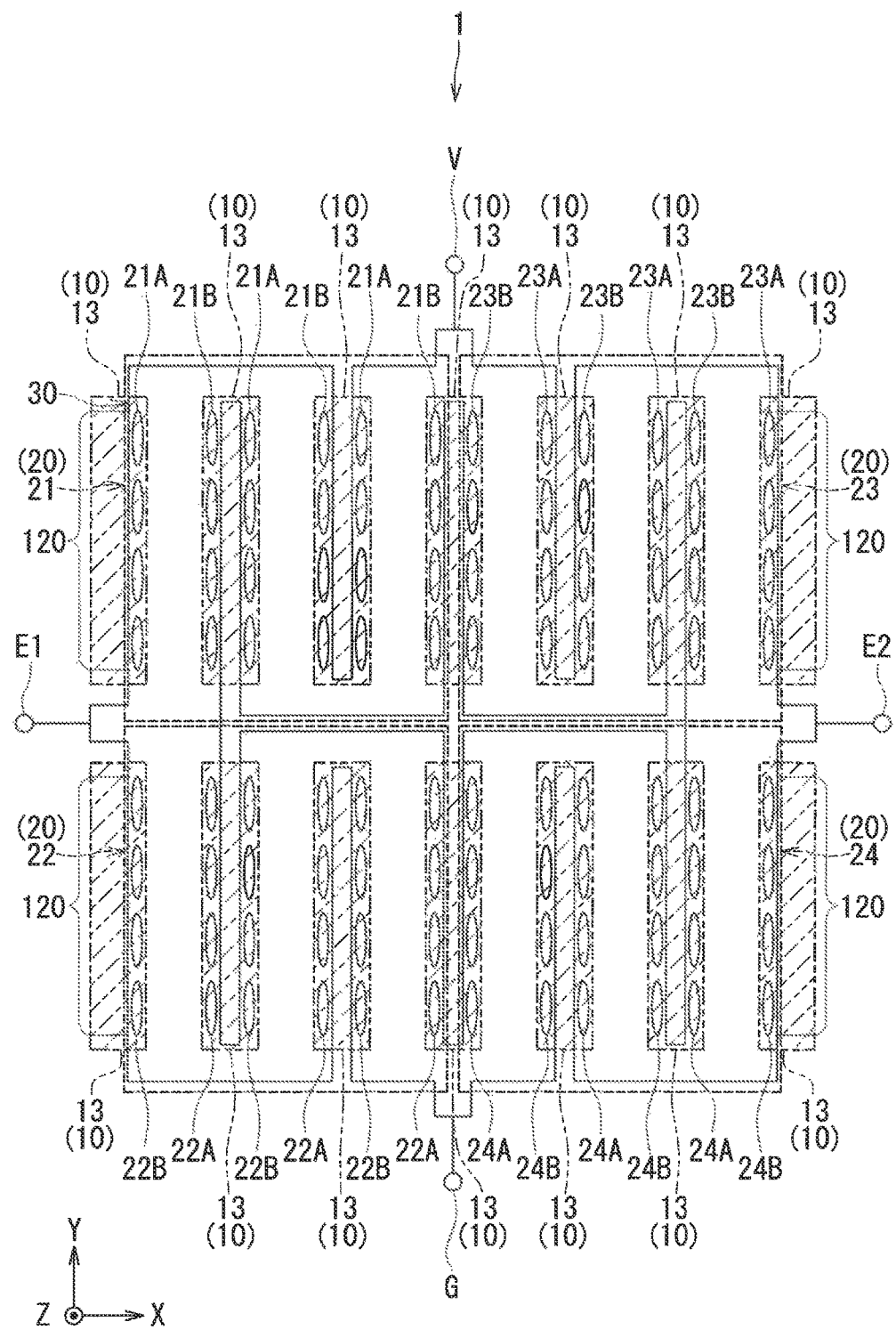
FIG. 25 is an explanatory diagram schematically illustrating the configuration of a magnetic sensor according to a ninth embodiment of the invention.
Figure 26:
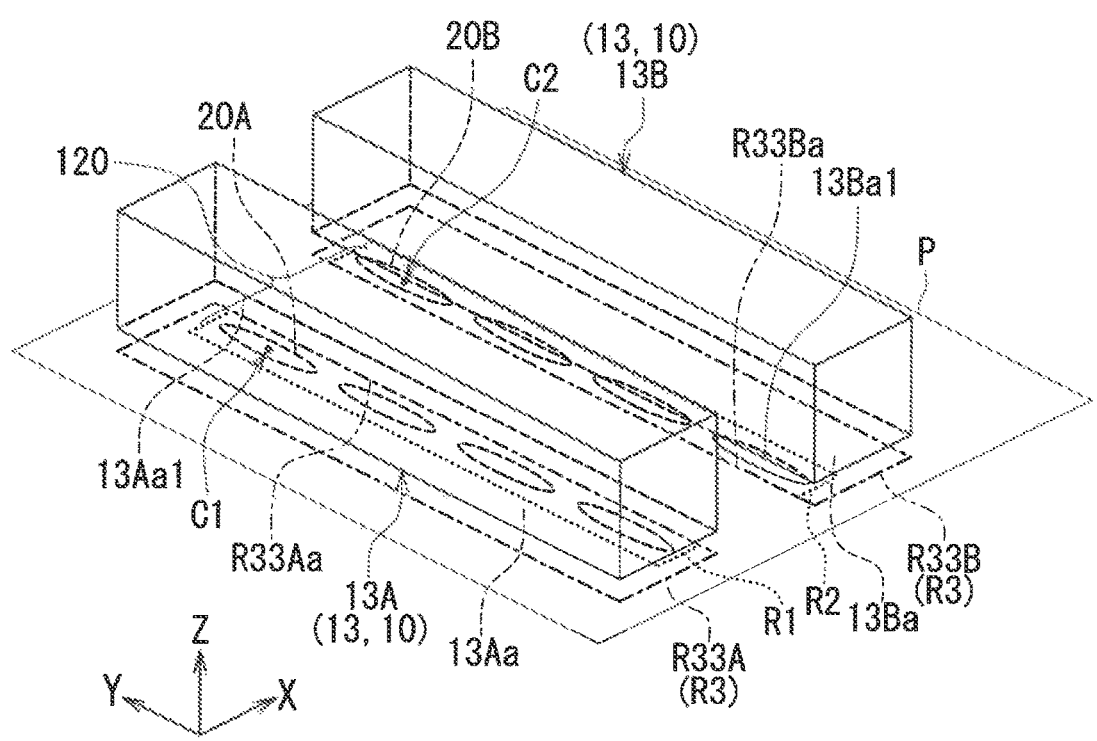
FIG. 26 is an explanatory diagram illustrating the positional relationship between yokes and first and second magnetic detection elements in the ninth embodiment of the invention.

A ninth embodiment of the present invention will now be described. First, reference is made to FIG. 25 and FIG. 26 to describe the configuration of the magnetic sensor according to the ninth embodiment. FIG. 25 is an explanatory diagram schematically illustrating the configuration of the magnetic sensor according to the ninth embodiment. FIG. 26 is an explanatory diagram illustrating the positional relationship between the yokes 13 and the first and second magnetic detection elements 20A and 20B.

The magnetic sensor 1 according to the present embodiment differs from the eighth embodiment in the following ways. In the present embodiment, each of the yokes 13 is disposed to overlap the first portion (the first magnetic detection elements 20A) or the second portion (the second magnetic detection elements 20B) of a magnetic detection element train 120. Here, by way of example, the positional relationship between the magnetic detection element train 120 of the first or fourth resistor section 21 or 24 and the yokes 13A and 13B will be described. FIG. 26 illustrates the magnetic detection element train 120 of the first or fourth resistor section 21 or 24 and the yokes 13A and 13B.

As has been described in relation to the eighth embodiment, the first element-placement region R1 is a region defining the position of the first magnetic detection elements 20A, and the second element-placement region R2 is a region defining the position of the second magnetic detection elements 20B. The end face projection region R3 is a region formed by vertically projecting the end face of the magnetic field conversion unit 10 onto the virtual plane P. The first yoke end face projection region R33A is a region formed by vertically projecting the first yoke end face 13Aa onto the virtual plane P. The second yoke end face projection region R33B is a region formed by vertically projecting the second yoke end face 13Ba onto the virtual plane P. In the present embodiment, in particular, the first element-placement region R1 lies only inside the first yoke end face projection region R33A, and the second element-placement region R2 lies only inside the second yoke end face projection region R33B.

The magnetic sensor 1 according to the present embodiment may include the wiring layer 130 described in relation to the second embodiment, in place of the wiring layer 30. The other configuration, function and effects of the present embodiment are the same as those of the second or eighth embodiment.

The present invention is not limited to the foregoing embodiments, and various modifications may be made thereto. For example, as far as the requirements of the appended claims are met, the numbers, shapes and locations of the yokes, the first magnetic detection elements and the second magnetic detection elements are not limited to the respective examples illustrated in the foregoing embodiments, but can be freely chosen. For example, the first and second magnetic detection elements may be circular in planar shape. In such a case, the magnetic field detection unit 20 may include a plurality of magnets for applying a bias magnetic field to the first and second magnetic detection elements in a direction parallel to the third virtual straight line Ly.

Further the magnetic field conversion unit 10 may include a plurality of yokes located below the lower electrodes, in addition to the yokes located above the upper electrodes. The yokes below the lower electrodes are offset from the yokes above the upper electrodes in the direction parallel to the second virtual straight line Lx so as to increase the conversion efficiency.

In the third and seventh embodiments, the magnetic field conversion unit 10 may include, in place of the two yokes 12, a single yoke formed by connecting the two yokes 12 in the Y direction.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising a magnetic field conversion unit and a magnetic field detection unit, wherein
the magnetic field conversion unit is formed of a soft magnetic material and configured to receive an input magnetic field and generate an output magnetic field, the input magnetic field containing an input magnetic field component in a direction parallel to a first virtual straight line,
the magnetic field detection unit is configured to receive the output magnetic field and generate an output signal corresponding to the input magnetic field component,
the output magnetic field contains an output magnetic field component in a direction parallel to a second virtual straight line intersecting the first virtual straight line, the output magnetic field component varying depending on the input magnetic field component,
the magnetic field conversion unit has an end face located at an end in the direction parallel to the first virtual straight line,
a first element-placement region and a second element-placement region lie in a virtual plane that includes the second virtual straight line and intersects the first virtual straight line,
each of the first and second element-placement regions lies only either inside or outside an end face projection region, the end face projection region being a region formed by vertically projecting the end face of the magnetic field conversion unit onto the virtual plane,
one of an inclination of a conversion efficiency at a given first point in the first element-placement region and an inclination of the conversion efficiency at a given second point in the second element-placement region has a positive value while the other has a negative value, where the conversion efficiency at a given point in the virtual plane refers to the ratio of a strength of the output magnetic field component at the given point to a strength of the input magnetic field component, and the inclination of the conversion efficiency at the given point refers to the ratio of a variation amount of the conversion efficiency at the given point to a positional variation amount of the given point when the given point is moved in one direction parallel to the second virtual straight line,
the magnetic field detection unit includes a first magnetic detection element and a second magnetic detection element each of which is configured to receive a portion of the output magnetic field component,
the first magnetic detection element is disposed to intersect the first element-placement region and not to intersect the second element-placement region,
the second magnetic detection element is disposed to intersect the second element-placement region and not to intersect the first element-placement region,
the first magnetic detection element generates a first detection value corresponding to the portion of the output magnetic field component received by the first magnetic detection element,
the second magnetic detection element generates a second detection value corresponding to the portion of the output magnetic field component received by the second magnetic detection element, and
the output signal depends on a composite value obtained by compositing the first detection value and the second detection value.

2. The magnetic sensor according to claim 1, wherein each of the first and second magnetic detection elements is shaped to be elongated in a direction parallel to a third virtual straight line that is located in the virtual plane and orthogonal to the second virtual straight line.

3. The magnetic sensor according to claim 1, wherein
the first magnetic detection element is a first magnetoresistive element,
the second magnetic detection element is a second magnetoresistive element,
the first detection value is a resistance value of the first magnetoresistive element,
the second detection value is a resistance value of the second magnetoresistive element, and
the composite value is a composite resistance value of the first magnetoresistive element and the second magnetoresistive element.

4. The magnetic sensor according to claim 3, wherein the first magnetoresistive element and the second magnetoresistive element are connected in parallel.

5. The magnetic sensor according to claim 3, wherein the first magnetoresistive element and the second magnetoresistive element are connected in series.

6. The magnetic sensor according to claim 1, wherein the second virtual straight line is orthogonal to the first virtual straight line.

7. The magnetic sensor according to claim 1, further comprising a substrate for holding the first magnetic detection element and the second magnetic detection element.

8. The magnetic sensor according to claim 1, wherein a ratio of an absolute value of the inclination of the conversion efficiency at a second center of gravity to an absolute value of the inclination of the conversion efficiency at a first center of gravity is within a range of 0.48 to 2.1, where the first center of gravity refers to the center of gravity of a portion of the first element-placement region that intersects the first magnetic detection element, and the second center of gravity refers to the center of gravity of a portion of the second element-placement region that intersects the second magnetic detection element.

9. The magnetic sensor according to claim 1, wherein
the first element-placement region lies only outside the end face projection region,
the second element-placement region lies only inside the end face projection region, and
the end face projection region has an edge located between the first and second element-placement regions and orthogonal to the second virtual straight line.

10. The magnetic sensor according to claim 1, wherein
the magnetic field conversion unit includes a yoke,
the yoke has a yoke end face located at an end in the direction parallel to the first virtual straight line,
the end face projection region includes a yoke end face projection region formed by vertically projecting the yoke end face onto the virtual plane, and
the first element-placement region and the second element-placement region lie only outside the end face projection region, and are located on opposite sides of the yoke end face projection region in the direction parallel to the second virtual straight line.

11. The magnetic sensor according to claim 1, wherein
the magnetic field conversion unit includes a yoke,
the yoke has a yoke end face located at an end in the direction parallel to the first virtual straight line, the end face projection region includes a yoke end face projection region formed by vertically projecting the yoke end face onto the virtual plane, the first element-placement region and the second element-placement region lie only inside the yoke end face projection region, the yoke end face projection region has a first edge and a second edge located at opposite ends in the direction parallel to the second virtual straight line, the first element-placement region is located between the first edge and the second element-placement region, and the second element-placement region is located between the second edge and the first element-placement region.

12. The magnetic sensor according to claim 1, wherein the magnetic field conversion unit includes a first yoke and a second yoke, the first yoke has a first yoke end face located at an end of the first yoke in the direction parallel to the first virtual straight line, the second yoke has a second yoke end face located at an end of the second yoke in the direction parallel to the first virtual straight line, the first element-placement region is closer to the first yoke end face than to the second yoke end face, the second element-placement region is closer to the second yoke end face than to the first yoke end face, the first yoke end face has a first edge closest to the first element-placement region, the second yoke end face has a second edge closest to the second element-placement region, and one of a first distance and a second distance decreases while the other increases when the given first point in the first element-placement region and the given second point in the second element-placement region are moved in one direction parallel to the second virtual straight line, where the first distance refers to the distance between the given first point and the first edge, and the second distance refers to the distance between the given second point and the second edge.

13. A magnetic sensor comprising a magnetic field conversion unit and a magnetic field detection unit, wherein the magnetic field conversion unit is formed of a soft magnetic material and configured to receive an input magnetic field and generate an output magnetic field, the input magnetic field containing an input magnetic field component in a direction parallel to a first virtual straight line, the magnetic field detection unit is configured to receive the output magnetic field and generate an output signal corresponding to the input magnetic field component, the output magnetic field contains an output magnetic field component in a direction parallel to a second virtual straight line intersecting the first virtual straight line, the output magnetic field component varying depending on the input magnetic field component, the magnetic field detection unit includes a first resistor section and a second resistor section each of which has a resistance value that varies depending on the input magnetic field component, the first resistor section and the second resistor section are connected in series and configured to be energized, when the input magnetic field component varies, one of the resistance value of the first resistor section and the resistance value of the second resistor section increases while the other decreases, the output signal depends on a potential at a connection point between the first resistor section and the second resistor section, each of the first and second resistor sections includes a first magnetoresistive element and a second magnetoresistive element each of which is configured to receive a portion of the output magnetic field component, the magnetic field conversion unit has an end face located at an end in the direction parallel to the first virtual straight line, a first element-placement region and a second element-placement region lie in a virtual plane that includes the second virtual straight line and intersects the first virtual straight line, each of the first and second element-placement regions lies only either inside or outside an end face projection region, the end face projection region being a region formed by vertically projecting the end face of the magnetic field conversion unit onto the virtual plane, one of an inclination of a conversion efficiency at a given first point in the first element-placement region and an inclination of the conversion efficiency at a given second point in the second element-placement region has a positive value while the other has a negative value, where the conversion efficiency at a given point in the virtual plane refers to the ratio of a strength of the output magnetic field component at the given point to a strength of the input magnetic field component, and the inclination of the conversion efficiency at the given point refers to the ratio of a variation amount of the conversion efficiency at the given point to a positional variation amount of the given point when the given point is moved in one direction parallel to the second virtual straight line, the first magnetoresistive element is disposed to intersect the first element-placement region and not to intersect the second element-placement region, the second magnetoresistive element is disposed to intersect the second element-placement region and not to intersect the first element-placement region, the first magnetoresistive element has a first resistance value corresponding to the portion of the output magnetic field component received by the first magnetoresistive element, the second magnetoresistive element has a second resistance value corresponding to the portion of the output magnetic field component received by the second magnetoresistive element, and the first magnetoresistive element and the second magnetoresistive element are connected in parallel or in series.

14. A magnetic sensor comprising a magnetic field conversion unit and a magnetic field detection unit, wherein the magnetic field conversion unit is formed of a soft magnetic material and configured to receive an input magnetic field and generate an output magnetic field, the input magnetic field containing an input magnetic field component in a direction parallel to a first virtual straight line, the magnetic field detection unit is configured to receive the output magnetic field and generate an output signal corresponding to the input magnetic field component, the output magnetic field contains an output magnetic field component in a direction parallel to a second virtual straight line intersecting the first virtual straight line, the output magnetic field component varying depending on the input magnetic field component, the magnetic field detection unit includes a power supply port, a ground port, a first output port, a second output port, a first resistor section, a second resistor section, a third resistor section, and a fourth resistor section, each of the first to fourth resistor sections having a resistance value that varies depending on the input magnetic field component, the first resistor section is provided between the power supply port and the first output port, the second resistor section is provided between the first output port and the ground port, the third resistor section is provided between the power supply port and the second output port, the fourth resistor section is provided between the second output port and the ground port, the magnetic field detection unit is configured to be energized between the power supply port and the ground port, when the input magnetic field component varies, the resistance values of the first to fourth resistor sections vary such that the resistance values of the first and fourth resistor sections increase while the resistance values of the second and third resistor sections decrease, or such that the resistance values of the first and fourth resistor sections decrease while the resistance values of the second and third resistor sections increase, the output signal depends on a potential difference between the first output port and the second output port, each of the first to fourth resistor sections includes a first magnetoresistive element and a second magnetoresistive element each of which is configured to receive a portion of the output magnetic field component, the magnetic field conversion unit has an end face located at an end in the direction parallel to the first virtual straight line, a first element-placement region and a second element-placement region lie in a virtual plane that includes the second virtual straight line and intersects the first virtual straight line, each of the first and second element-placement regions lies only either inside or outside an end face projection region, the end face projection region being a region formed by vertically projecting the end face of the magnetic field conversion unit onto the virtual plane, one of an inclination of a conversion efficiency at a given first point in the first element-placement region and an inclination of the conversion efficiency at a given second point in the second element-placement region has a positive value while the other has a negative value, where the conversion efficiency at a given point in the virtual plane refers to the ratio of a strength of the output magnetic field component at the given point to a strength of the input magnetic field component, and the inclination of the conversion efficiency at the given point refers to the ratio of a variation amount of the conversion efficiency at the given point to a positional variation amount of the given point when the given point is moved in one direction parallel to the second virtual straight line, the first magnetoresistive element is disposed to intersect the first element-placement region and not to intersect the second element-placement region, the second magnetoresistive element is disposed to intersect the second element-placement region and not to intersect the first element-placement region, the first magnetoresistive element has a first resistance value corresponding to the portion of the output magnetic field component received by the first magnetoresistive element, the second magnetoresistive element has a second resistance value corresponding to the portion of the output magnetic field component received by the second magnetoresistive element, and the first magnetoresistive element and the second magnetoresistive element are connected in parallel or in series.

\* \* \* \* \*